(12) United States Patent  
Nakazawa et al.

(10) Patent No.: US 11,133,347 B2  
(45) Date of Patent: Sep. 28, 2021

(54) ACTIVE MATRIX SUBSTRATE AND IMAGING PANEL WITH SAME

(71) Applicant: SHARP KABUSHIKI KAISHA, Sakai (JP)

(72) Inventors: Makoto Nakazawa, Sakai (JP); Fumiki Nakano, Sakai (JP); Rikiya Takita, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 132 days.

(21) Appl. No.: 16/568,855

(22) Filed: Sep. 12, 2019

(65) Prior Publication Data

US 2020/0091222 A1    Mar. 19, 2020

Related U.S. Application Data

(60) Provisional application No. 62/731,595, filed on Sep. 14, 2018.

(51) Int. Cl.
| | |
|---|---|
| *H01L 27/146* | (2006.01) |
| *G01T 1/20* | (2006.01) |
| *H01L 29/786* | (2006.01) |

(52) U.S. Cl.  
CPC ...... *H01L 27/14663* (2013.01); *G01T 1/2018* (2013.01); *H01L 27/14614* (2013.01); *H01L 29/78693* (2013.01)

(58) Field of Classification Search  
None  
See application file for complete search history.

(56) References Cited

U.S. PATENT DOCUMENTS

| 7,872,415 B2 * | 1/2011 | Kim .................... H01L 51/5253 |
| | | 313/506 |
| 2009/0174924 A1 * | 7/2009 | Kubota ............... H01L 27/3276 |
| | | 359/259 |
| 2009/0236496 A1 | 9/2009 | Tanada et al. |
| 2011/0127593 A1 | 6/2011 | Hayashi |
| 2018/0314122 A1 | 11/2018 | Saitoh et al. |

FOREIGN PATENT DOCUMENTS

| JP | 2009-260305 A | 11/2009 |
| JP | 2011-114310 A | 6/2011 |
| WO | 2017/077994 A1 | 5/2017 |

* cited by examiner

*Primary Examiner* — Edwin C Gunberg  
(74) *Attorney, Agent, or Firm* — ScienBiziP, P.C.

(57) ABSTRACT

An active matrix substrate includes a photoelectric conversion element 12, a first inorganic insulating film 106, a first planarizing film 107, and a second inorganic insulating film 108a and/or 109 on a substrate 101. The first inorganic insulating film 106, the first planarizing film 107, and the second inorganic insulating film 108a and/or 109 are provided up to an end P2 of the substrate. The first inorganic insulating film 106 covers a surface of the photoelectric conversion element 12, the first planarizing film 107 has a tapered portion, and an angle θ between the tapered portion and the first inorganic insulating film 106 is an acute angle. The second inorganic insulating film 108a and/or 109 covers the first planarizing film 107.

9 Claims, 21 Drawing Sheets

| TAPER ANGLE ($\theta$) | RELIABILITY EVALUATION |
|---|---|
| $\theta \leq 25°$ | ○ |
| $25° < \theta \leq 30°$ | △ |
| $30° < \theta \leq 40°$ | △ |
| $40° < \theta \leq 50°$ | × |
| $50° < \theta \leq 60°$ | × |

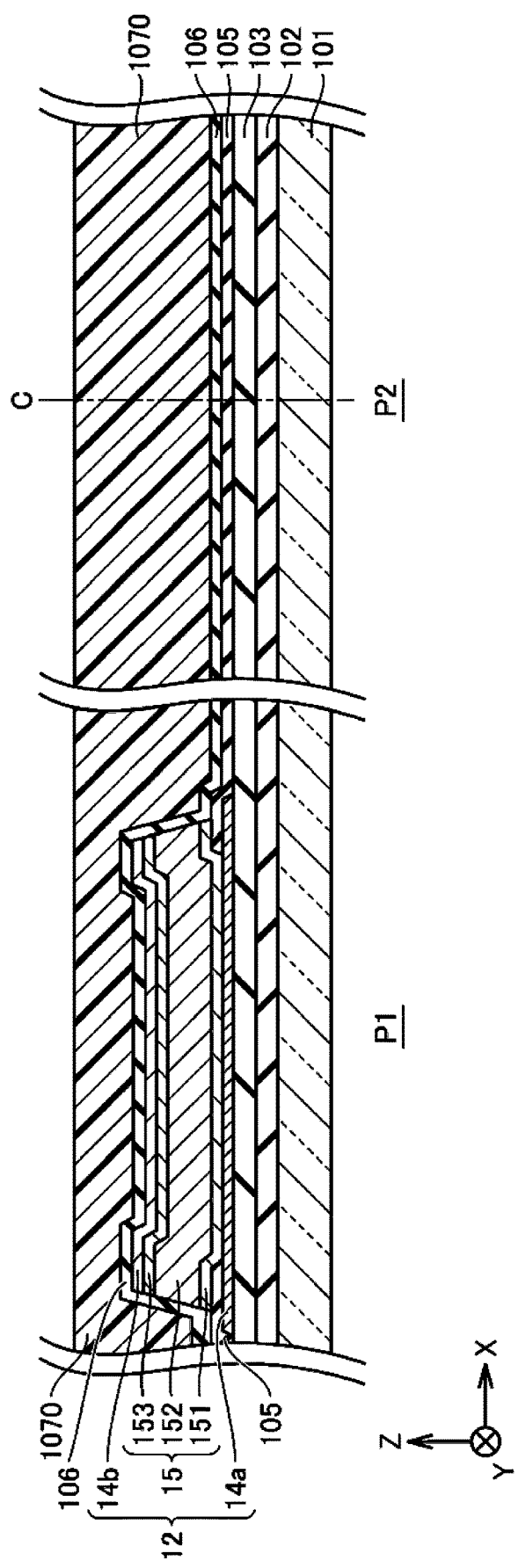

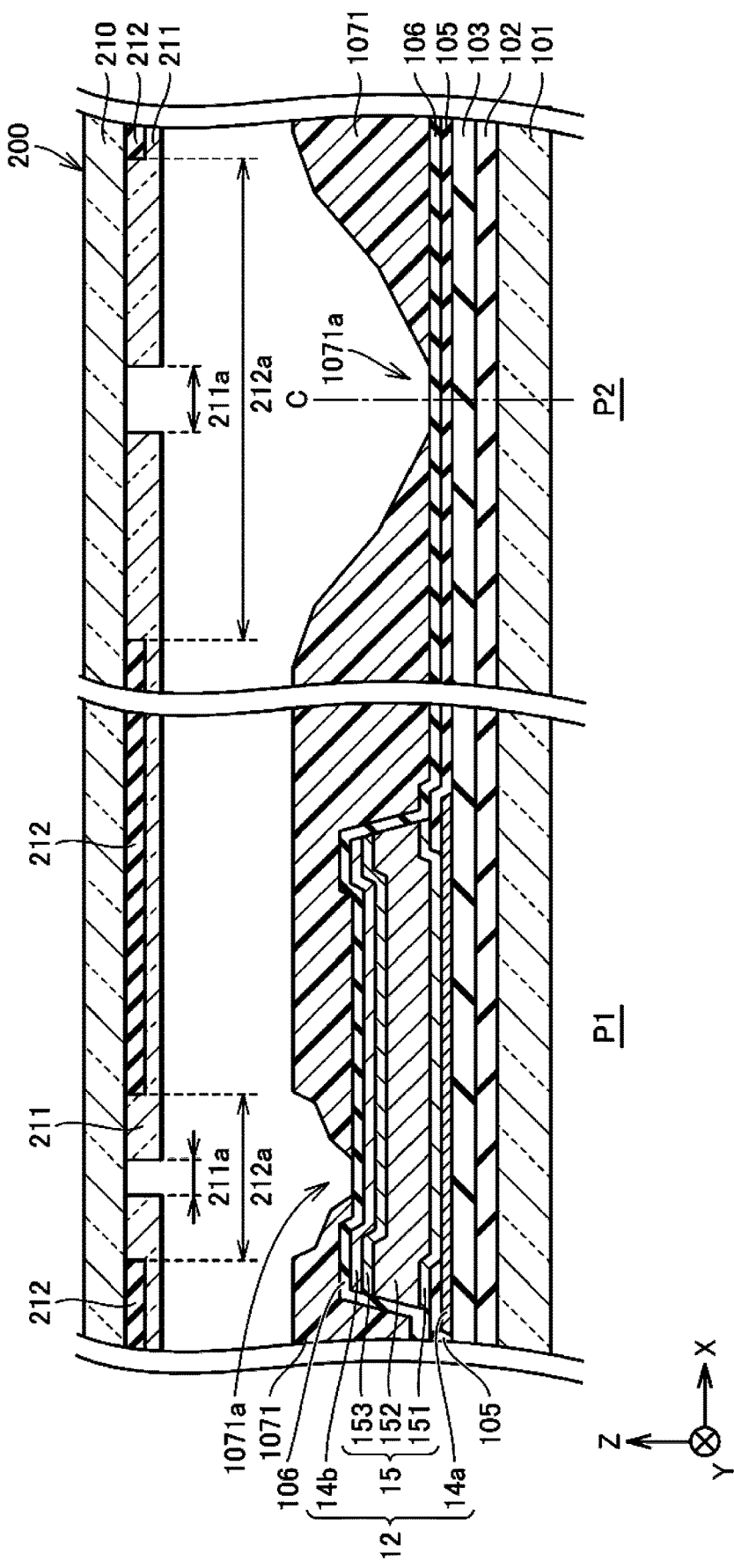

ACTIVE MATRIX SUBSTRATE AND IMAGING PANEL WITH SAME

TECHNICAL FIELD

The invention disclosed hereinbelow relates to an active matrix substrate and an image capturing panel provided with the same.

BACKGROUND ART

In the related art, an image capturing panel provided with photoelectric conversion elements in pixels is known, and technologies for reducing a leaking current of the photoelectric conversion elements in the image capturing panel have been proposed. For example, Japanese Unexamined Patent Application Publication No. 2011-114310 discloses a technology for reducing a leaking current of photoelectric conversion elements formed using PIN photodiodes. According to the document, a compound layer including a compound of silicon (Si) and metal is provided on a surface of a p-type silicon (p-Si) film such that the compound layer surrounds upper electrodes of photoelectric conversion elements. The compound layer is a protective film for reducing damage due to etching that is performed when the photoelectric conversion elements are produced, and a resistance of the portion where the compound layer is provided is reduced to enhance responsiveness of charge transfer in the periphery of the upper electrodes.

Incidentally, in a case of an image capturing panel adapted such that a planarizing film that covers photoelectric conversion elements is provided on a side of upper electrodes of the photoelectric conversion elements and a bias wire for supplying a bias voltage to the upper electrodes is provided on the planarizing film, a contact hole for connecting the bias wire and the upper electrodes is formed in the planarizing film. The planarizing film is generally made of a resin or the like and tends to have higher water absorbance at a higher temperature. Therefore, water may enter the contact hole portion provided in the planarizing film or the planarizing film portion provided at an end of a substrate in some cases. If water enters the planarizing film, a leaking current of the photoelectric conversion elements is likely to flow.

SUMMARY OF INVENTION

An active matrix substrate that solves the aforementioned problems includes: a substrate; a photoelectric conversion element provided on the substrate; a first inorganic insulating film that covers a surface of the photoelectric conversion element; a first planarizing film that covers the first inorganic insulating film; and a second inorganic insulating film provided on a side of the first planarizing film opposite to the first inorganic insulating film, in which the first planarizing film, the first inorganic insulating film, and the second inorganic insulating film are provided up to an end of the substrate, the first planarizing film has a tapered portion at the end of the substrate, and an angle between the tapered portion and a surface of the first inorganic insulating film is an acute angle, and the second inorganic insulating film covers the first planarizing film at the end of the substrate.

With the aforementioned configuration, it is possible to inhibit water from invading an active matrix substrate.

BRIEF DESCRIPTION OF DRAWINGS

FIG. 9A is a sectional view illustrating a process for producing an active matrix substrate that has the pixel and the substrate end illustrated in FIGS. 8A and 8B and is a diagram illustrating a process for forming a planarizing film that covers photoelectric conversion elements at a pixel and a substrate end.

FIG. 9B is a sectional view illustrating a process for patterning the planarizing film formed in FIG. 9A.

DESCRIPTION OF EMBODIMENTS

Figure 1:
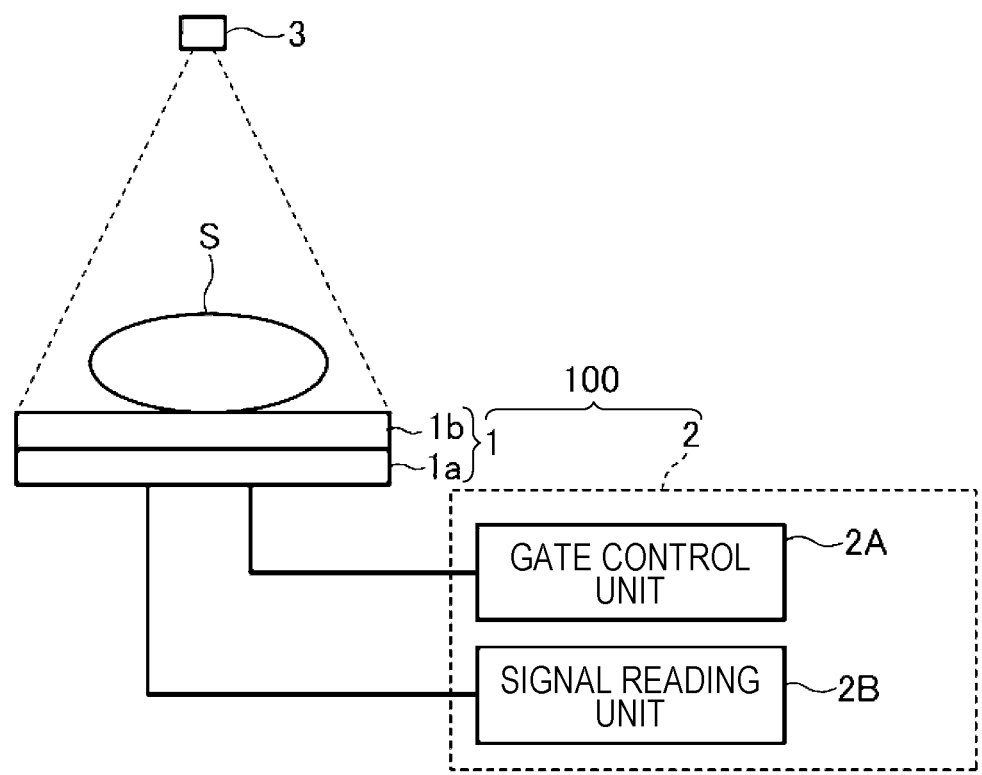
FIG. 1 is a schematic view illustrating an X-ray image capturing device according to a first embodiment.

Hereinafter, embodiments of the invention will be described in detail with reference to the drawings. The same reference numerals will be used to denote sentences and corresponding portions the same as those in the drawings, and description thereof will not be repeated.

First Embodiment (Configuration)

FIG. 1 is a schematic view illustrating an X-ray image capturing device to which an active matrix substrate according to an embodiment is applied. An X-ray image capturing device 100 includes an image capturing panel 1 provided with an active matrix substrate 1a and a scintillator 1b and a control unit 2.

The control unit 2 includes a gate control unit 2A and a signal reading unit 2B. An X-ray source 3 irradiates an object S with an X-ray. The X-ray image capturing device 100 in which the X-ray that has transmitted through the object S is converted into fluorescent light (hereinafter, scintillation light) by the scintillator 1b disposed above the active matrix substrate 1a acquires an X-ray image by imaging the scintillation light using the image capturing panel 1 and the control unit 2.

Figure 2:
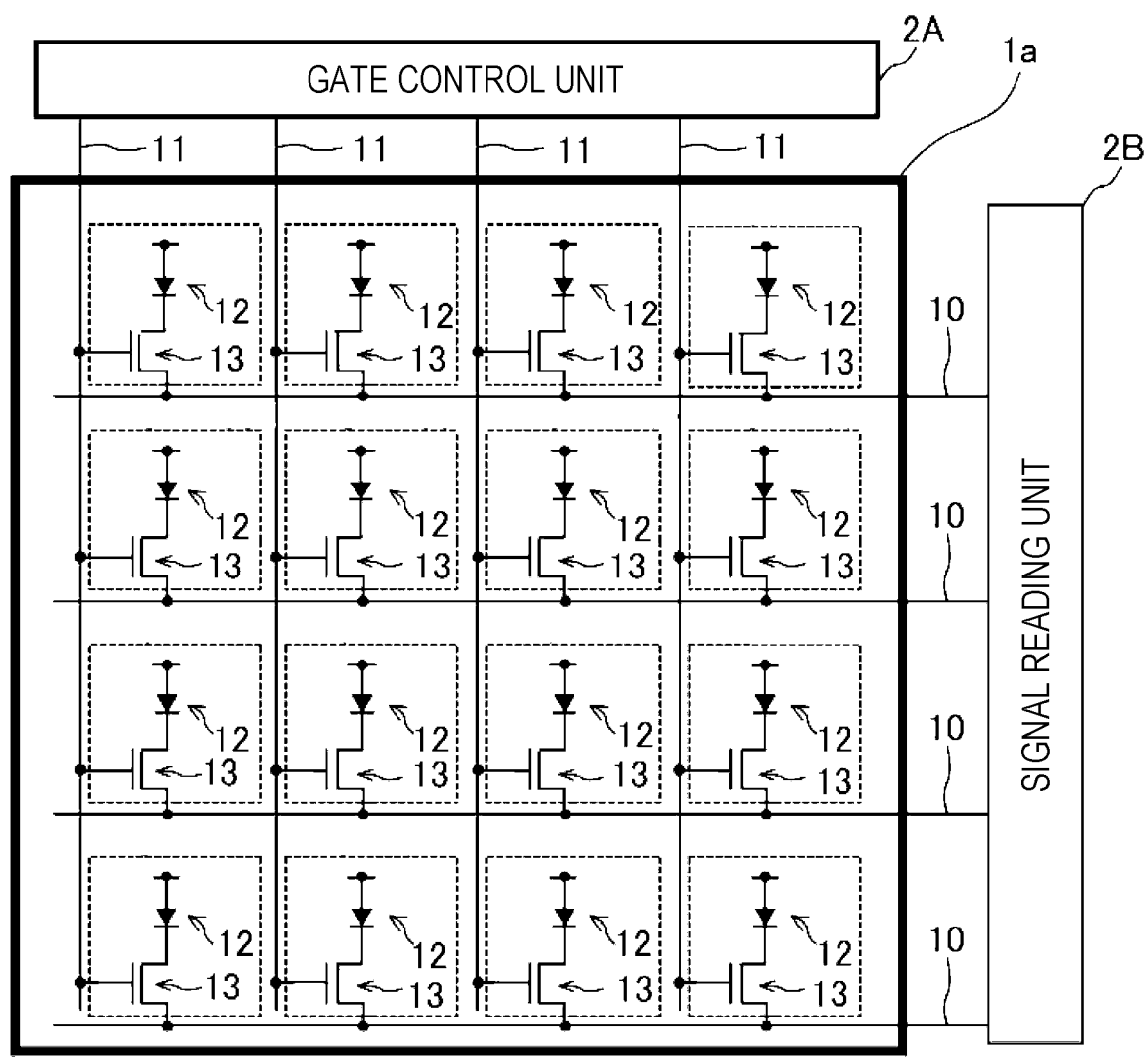
FIG. 2 is a schematic view illustrating an outline configuration of an active matrix substrate illustrated in FIG. 1.

FIG. 2 is a schematic view illustrating an outline configuration of the active matrix substrate 1a. As illustrated in FIG. 2, a plurality of source wires 10 and a plurality of gate wires 11 that intersects with the plurality of source wires 10 are formed on the active matrix substrate 1a. The gate wires 11 are connected to the gate control unit 2A, and the source wires 10 are connected to the signal reading unit 2B.

The active matrix substrate 1a has TFTs 13 connected to the source wires 10 and the gate wires 11 at positions at which the source wires 10 and the gate wires 11 intersect with each other. In addition, photodiodes 12 are provided in regions (hereinafter, pixels) surrounded by the source wires 10 and the gate wires 11. In the pixels, scintillation light converted from an X-ray that has transmitted through the object S is converted into an electrical charge in accordance with a light amount thereof by the photodiodes 12.

The respective gate wires 11 on the active matrix substrate 1a are sequentially switched into a selected state by the gate control unit 2A, and the TFTs 13 connected to the gate wire 11 in the selected state are brought into an ON state. If the TFTs 13 are brought into the ON state, signals in accordance with electrical charges converted by the photodiodes 12 are output to the signal reading unit 2B via the source wires 10.

Figure 3:
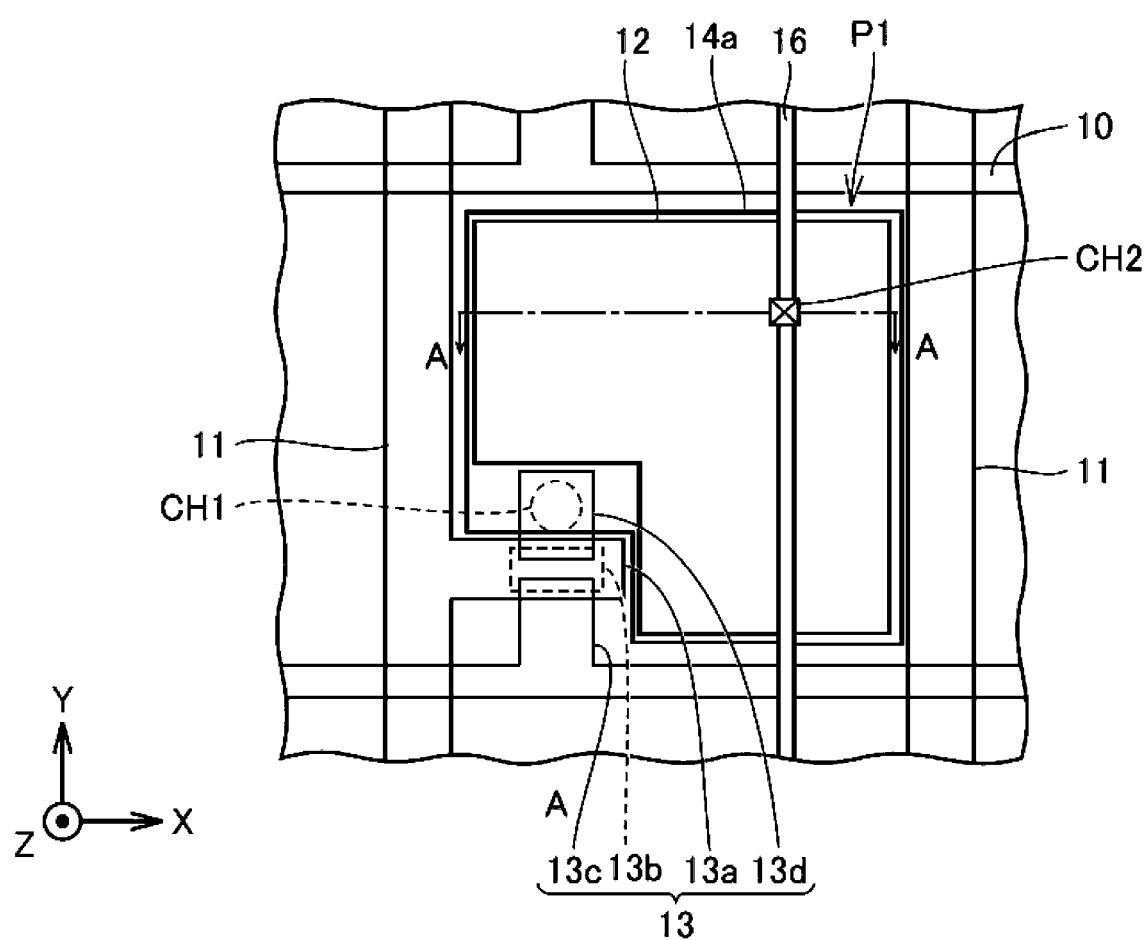
FIG. 3 is a plan view illustrating, in an enlarged manner, a part of pixels provided on the active matrix substrate illustrated in FIG. 2.

FIG. 3 is a plan view illustrating, in an enlarged manner, a part of pixels on the active matrix substrate 1a illustrated in FIG. 2.

As illustrated in FIG. 3, the photodiodes 12 and the TFTs 13 are provided at pixels P1 surrounded by the gate wires 11 and the source wires 10.

Each photodiode 12 has a pair of electrodes and a photoelectric conversion layer provided between the pair of electrodes. Note that a specific configuration of the photodiode 12 will be described later.

Each TFT 13 has a gate electrode 13a integrated with each gate wire 11, a semiconductor active layer 13b, a source electrode 13c integrated with each source wire 10, and a drain electrode 13d. The drain electrode 13d and one electrode of the photodiode 12 are connected to each other via a contact hole CH1.

The gate electrode 13a and the gate wire 11 are formed from metal films in which tantalum nitride (TaN) and tungsten (W) are laminated in an order from the lower layer in this example. The film thicknesses of tantalum nitride (TaN) and tungsten (W) are preferably about 300 nm and about 30 nm, respectively, for example. Note that the structures, the materials, and the film thicknesses of the gate electrode 13a and the gate wire 11 are not limited thereto.

In addition, the semiconductor active layer 13b is formed using an amorphous oxide semiconductor or the like that contains indium (In), gallium (Ga), and zinc (Zn) at a prescribed ratio. The film thickness of the semiconductor active layer 13b is preferably about 100 nm, for example. However, the material and the film thickness of the semiconductor active layer 13b are not limited to those in the above description.

The source electrode 13c and the drain electrode 13d have a laminated structure in which three metal films are laminated. The three metal films may be formed from metal films that are made of titanium (Ti), aluminum (Al), and titanium (Ti) in this order from the lower layer. In this case, the film thicknesses of titanium (Ti), aluminum (Al), and titanium (Ti) are preferably about 50 nm, about 300 nm, and about 50 nm, respectively, for example. Note that the structures, the materials, and the film thicknesses of the source electrode 13c and the drain electrode 13d are not limited to those in the above description.

In addition, the gate electrode 13a and the source electrode 13c may not be integrated with the gate wire 11 and the source wire 10, respectively. The gate electrode 13a and the gate wire 11 may be provided in mutually different layers, and the gate wire 11 and the gate electrode 13a may be connected to each other via the contact hole. In addition, the source electrode 13c and the source wire 10 may be provided in mutually different layers, and the source wire 10 and the source electrode 13c may be connected to each other via the contact hole. With such a configuration, it is possible to reduce resistances of the gate wire 11 and the source wire 10.

A bias wire 16 is disposed such that the bias wire 16 overlaps with the photodiode 12 in a pixel, and the photodiode 12 and the bias wire 16 are connected to each other via a contact hole CH2. The bias wire 16 supplies a bias voltage to the photodiode 12. A specific configuration of the bias wire 16 will be described with reference to a sectional view of a pixel illustrated in FIG. 4.

Figure 4:
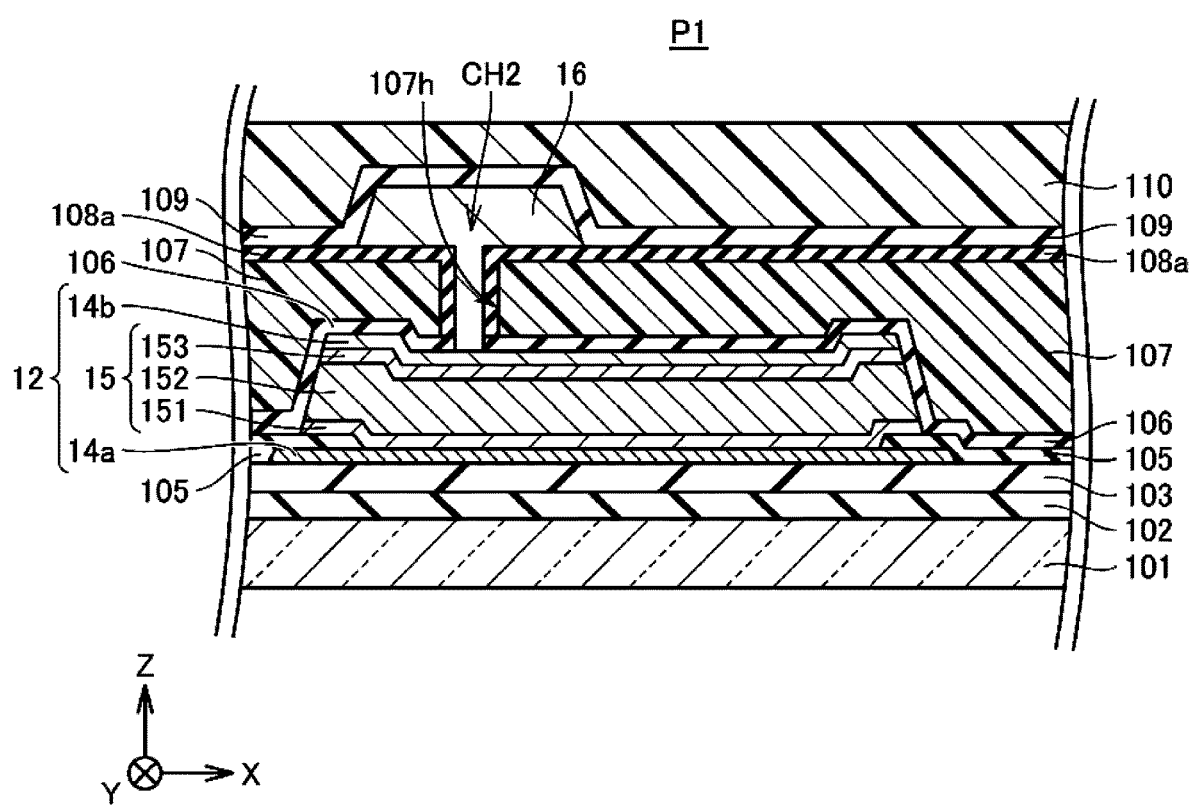
FIG. 4 is a sectional view of the pixel in FIG. 3 taken along the line A-A.

FIG. 4 is a sectional view of the pixel P1 in FIG. 3 taken along the line A-A. Here, a sectional structure of a portion of the pixel P1 in which the bias wire 16 and the photodiode 12 overlap with each other in plan view will be mainly described in a specific manner. In the following description, the positive direction side of the Z axis in FIG. 4 will be referred to as an upper side, and the negative direction side of the Z axis will be referred to as a lower side in some cases.

As illustrated in FIG. 4, a gate insulating film 102 is formed on one surface of a substrate 101. The substrate 101 is a substrate that has insulating properties and is formed from, for example, a glass substrate or the like.

Note that although not illustrated in the drawing, the gate electrode 13a and the gate wire 11 are provided in the same surface of the substrate 101 and the gate electrode 13a and the gate wire 11 are covered with the gate insulating film 102.

The gate insulating film 102 has a laminated structure in which two inorganic insulating films are laminated in this example. The two inorganic insulating films are formed from inorganic insulating films made of silicon nitride ($SiN_x$) and silicon oxide ($SiO_x$) in this order from the lower layer, for example. The film thicknesses of the silicon nitride ($SiN_x$) and silicon oxide ($SiO_x$) are preferably about 325 nm and about 50 nm, respectively. Note that the structure, the material, and the film thickness of the gate insulating films 102 are not limited to those in the above description.

A first insulating film 103 is provided on the gate insulating film 102. Although not illustrated in the drawing, the semiconductor active layer 13b is provided on the gate insulating film 102 at a position at which the semiconductor active layer 13b overlaps with the gate electrode 13a in plan view, and the source electrode 13c and the drain electrode 13d are provided on the gate insulating film 102 such that the source electrode 13c and the drain electrode 13d are separated from each other above the semiconductor active layer 13b. In addition, the contact hole CH1 (see FIG. 3) that penetrates through the first insulating film 103 is provided at a position at which the contact hole CH1 overlaps with the drain electrode 13d in plan view.

The first insulating film 103 is made of silicon oxide ($SiO_2$) in this example. In this case, the film thickness of the first insulating film 103 is preferably about 400 nm, for example. Note that the structure, the material, and the film thickness of the first insulating film 103 is not limited to those in the above description.

An electrode (hereinafter, a lower electrode) 14a on the side of a cathode of the photodiode 12 and a second insulating film 105 are provided on the first insulating film 103. The lower electrode 14a is connected to the drain electrode 13d (see FIG. 3) via the contact hole CH1 (see FIG. 3).

The lower electrode 14a has a laminated structure in which metal films made of titanium (Ti), aluminum (Al), and titanium (Ti) are laminated in this example. In this case, the film thicknesses of titanium (Ti), aluminum (Al), and titanium (Ti) are preferably about 50 nm, about 300 nm, and about 50 nm, respectively, for example. Note that the structure, the material, and the film thickness of the lower electrode 14a are not limited to those in the above description.

The second insulating film 105 is made of the same material as that of the first insulating film 103 in this example. That is, the second insulating film 105 is made of silicon oxide ($SiO_2$), and the film thickness thereof is about 350 nm, for example. Note that the structure, the material, and the film thickness of the second insulating film 105 are not limited to those in the above description.

A photoelectric conversion layer 15 is provided on the lower electrode 14a and the second insulating film 105 such that the photoelectric conversion layer 15 overlaps with the lower electrode 14a in plan view.

The photoelectric conversion layer 15 is formed such that an n-type amorphous semiconductor layer 151, an intrinsic amorphous semiconductor layer 152, and a p-type amorphous semiconductor layer 153 are laminated in this order in this example.

The n-type amorphous semiconductor layer 151 is made of amorphous silicon doped with an n-type impurity (phosphorus, for example).

The intrinsic amorphous semiconductor layer 152 is made of intrinsic amorphous silicon. The intrinsic amorphous semiconductor layer 152 is formed in contact with the n-type amorphous semiconductor layer 151.

The p-type amorphous semiconductor layer 153 is made of amorphous silicon doped with a p-type impurity (boron, for example). The p-type amorphous semiconductor layer 153 is formed in contact with the intrinsic amorphous semiconductor layer 152.

In this example, the film thicknesses of the n-type amorphous semiconductor layer 151, the intrinsic amorphous semiconductor layer 152, and the p-type amorphous semiconductor layer 153 are preferably about 20 nm, about 1200 nm, and about 20 nm, respectively, for example. Note that the dopants and the film thicknesses of the n-type amorphous semiconductor layer 151, the intrinsic amorphous semiconductor layer 152, and the p-type amorphous semiconductor layer 153 are not limited to those in the above description.

An electrode (hereinafter, an upper electrode) 14b on the side of an anode of the photodiode 12 is provided on the p-type amorphous semiconductor layer 153. The upper electrode 14b is formed from a transparent conductive film made of indium tin oxide (ITO), for example. In this case, the film thickness of the upper electrode 14b is preferably about 100 nm, for example. However, the structure, the material, and the film thickness of the upper electrode 14b are not limited to those in the above description.

A third insulating film 106 is provided on the second insulating film 105 such that the third insulating film 106 covers a surface of the photodiode 12. The third insulating film 106 is formed from an inorganic insulating film made of silicon nitride (SiN) in this example. In this case, the film thickness of the third insulating film 106 is preferably about 200 nm, for example. However, the structure, the material, and the film thickness of the third insulating film 106 are not limited to those in the above description.

In addition, a planarizing film 107 is provided on the third insulating film 106 such that the planarizing film 107 covers the third insulating film 106. The planarizing film 107 is formed using an organic insulating film made of a photosensitive acrylic resin, in this example, and the film thickness of the planarizing film 107 is preferably about 2500 nm, for example. However, the material and the film thickness of the planarizing film 107 are not limited to those in the above description.

The contact hole CH2 that penetrates through the third insulating film 106 and the planarizing film 107 is formed in the third insulating film 106 and the planarizing film 107 at a position at which the contact hole CH2 overlaps with the upper electrode 14b in plan view. That is, both the third insulating film 106 and the planarizing film 107 are separated by the contact hole CH2.

An upper surface of the planarizing film 107 and a surface of the planarizing film 107 at the contact hole CH2 are covered with a fourth insulating film 108a.

The fourth insulating film 108a is formed using an inorganic insulating film made of silicon nitride ($SiN_x$) in this example. The film thickness of the fourth insulating film 108*a* is preferably about 150 nm, for example. However, the structure, the material, and the film thickness of the fourth insulating film 108*a* are not limited to those in the above description.

The bias wire 16 is provided on the fourth insulating film 108*a* at a position at which the bias wire 16 overlaps with the contact hole CH2 in plan view, and the bias wire 16 and the upper electrode 14*b* are connected to each other via the contact hole CH2. The bias wire 16 is connected to the control unit 2 (see FIG. 1). The bias wire 16 applies a bias voltage input from the control unit 2 to the upper electrode 14*b*.

The bias wire 16 has a laminated structure in which metal films of laminated titanium (Ti), aluminum (Al), and titanium (Ti) are provided in lower layers and a transparent conductive film made of ITO is provided in an upper layer in this example. In this case, the film thicknesses of titanium (Ti), aluminum (Al), and titanium (Ti) are preferably about 50 nm, about 300 nm, and about 50 nm, respectively, for example. In addition, the film thickness of ITO is preferably about 100 nm, for example. Note that the structure, the material, and the film thickness of the bias wire 16 are not limited to those in the above description.

A fifth insulating film 109 is provided on the fourth insulating film 108*a* such that the fifth insulating film 109 covers the bias wire 16. In this example, the fifth insulating film 109 is formed using an inorganic insulating film made of silicon nitride (SiNx). The film thickness of the fifth insulating film 109 is preferably about 300 nm, for example. However, the structure, the material, and the film thickness of the fifth insulating film 109 are not limited to those in the above description.

The fifth insulating film 109 is covered with a planarizing film 110. The planarizing film 110 is formed using the same material as the aforementioned planarizing film 107 in this example. That is, the planarizing film 110 is formed using an organic insulating film made of a photosensitive acrylic resin. The film thickness of the planarizing film 110 is preferably about 3000 nm, for example. However, the material and the film thickness of the planarizing film 110 are not limited to those in the above description.

A sectional structure of the one pixel P1 taken along the line A-A is as described above. Note that the scintillator 1*b* is provided such that the scintillator 1*b* covers the planarizing film 110 provided on the uppermost surface of the active matrix substrate 1*a* though not illustrated in FIG. 4.

Here, a process for forming a film structure between the photodiode 12 and the bias wire 16, in particular, will be described in a specific manner in regard to a process of producing the active matrix substrate 1*a* according to the embodiment.

Figure 5A:
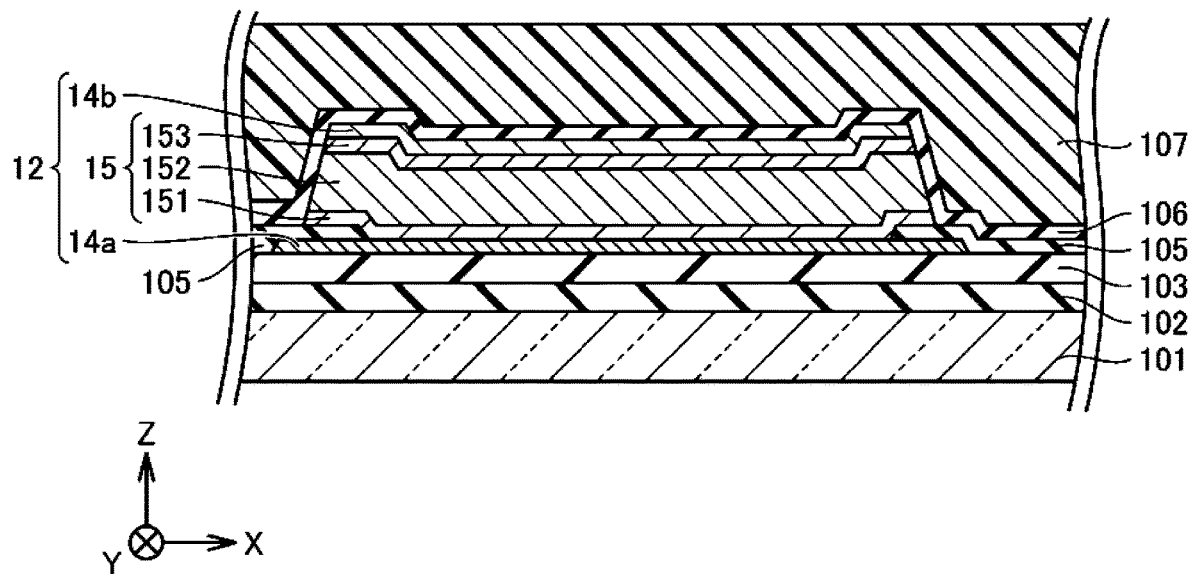
FIG. 5A is a sectional view illustrating a process for producing the pixel illustrated in FIG. 4 and is a sectional view illustrating a process for forming a planarizing film on a photoelectric conversion element.

As illustrated in FIG. 5A, the TFT 13 (not illustrated), the gate insulating film 102, the first insulating film 103, and the photodiode 12 are formed on the substrate 101 using known methods. Thereafter, the third insulating film 106 made of silicon nitride (SiNx) is created on the second insulating film 105 such that the third insulating film 106 covers the entire photodiode 12, using a chemical vapor deposition (CVD) method, for example. Then, the planarizing film 107 made of a photosensitive acrylic resin is formed such that the planarizing film 107 covers the third insulating film 106, using a slit coating method.

Figure 5B:
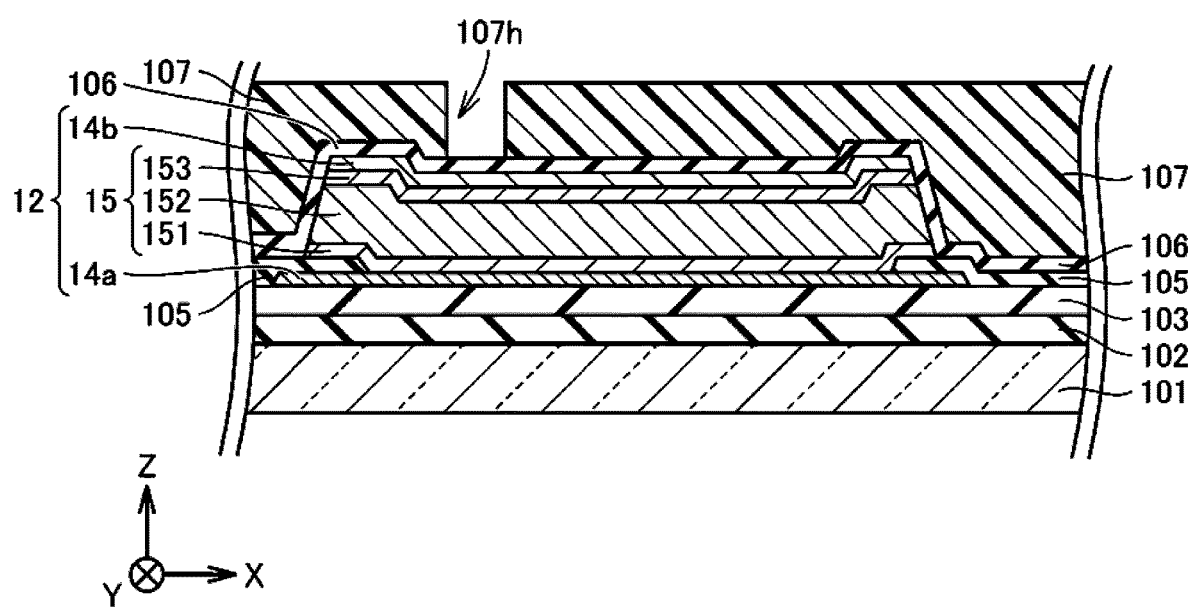
FIG. 5B is a sectional view illustrating a process for forming an opening in the planarizing film formed in FIG. 5A.

Next, an opening 107*h* that penetrates through the planarizing film 107 is formed at a position at which the opening 107*h* overlaps with the upper electrode 14*b* in plan view, using a photolithography method (see FIG. 5B).

Figure 5C:
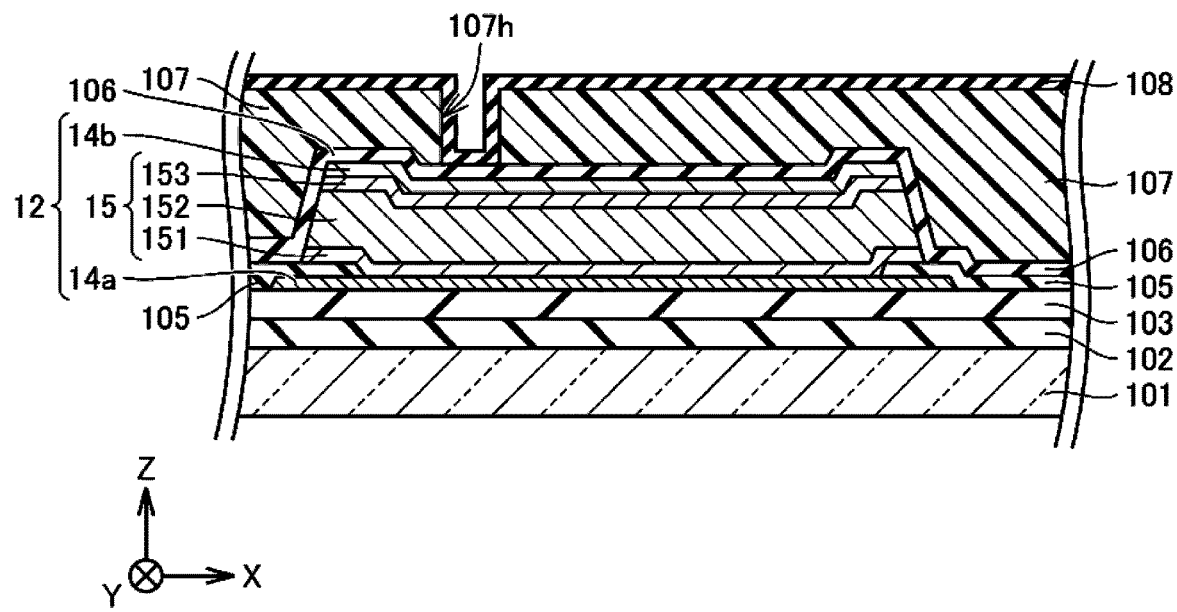
FIG. 5C is a sectional view illustrating a process for creating an inorganic insulating film as a fourth insulating film on the planarizing film illustrated in FIG. 5B.

Next, a fourth insulating film 108*a* made of silicon nitride (SiNx) is created on the planarizing film 107, using the CVD method (see FIG. 5C).

Figure 5D:
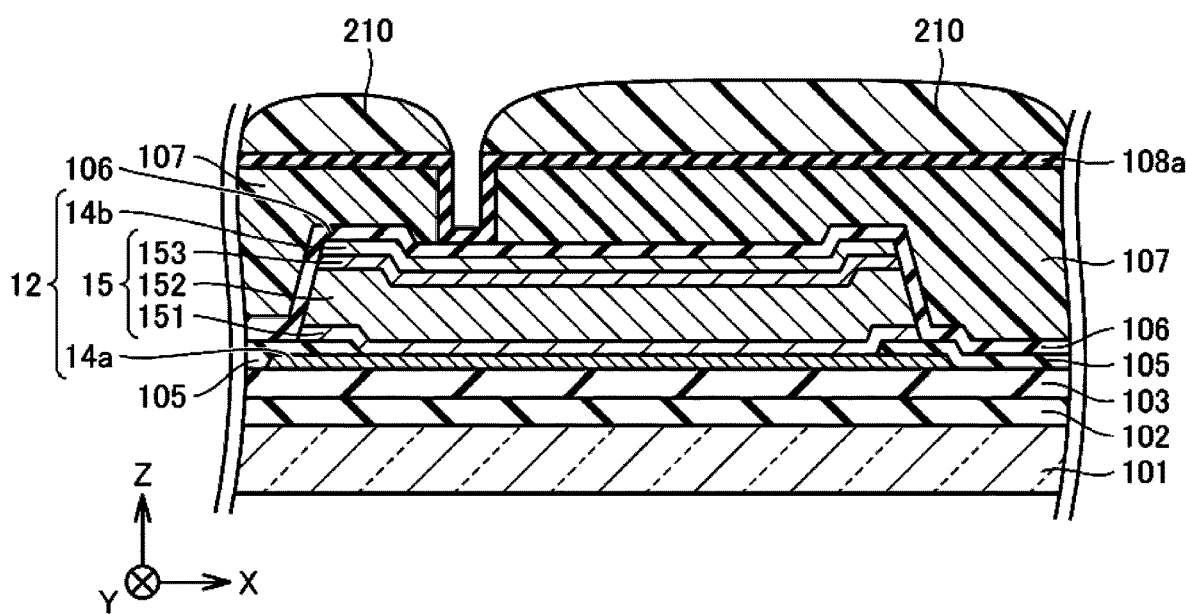
FIG. 5D is a sectional view illustrating a process for forming a resist on the fourth insulating film in FIG. 5C.
Figure 5E:
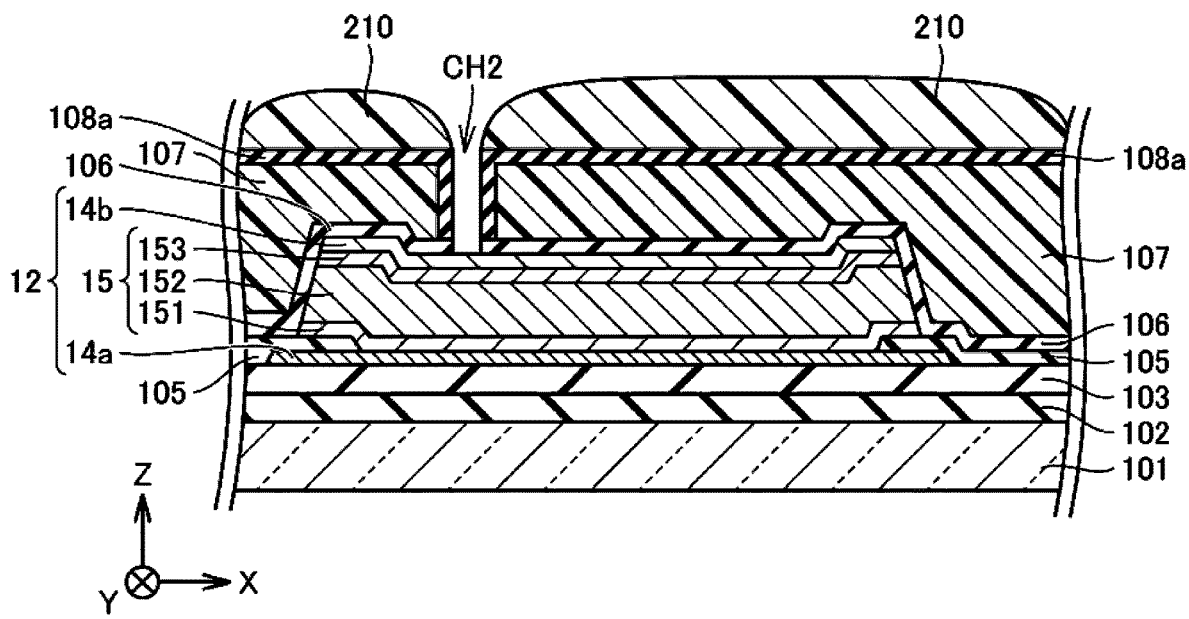
FIG. 5E is a sectional view illustrating a process for forming a contact hole that penetrates through the fourth insulating film in FIG. 5D and a third insulating film on the photoelectric conversion element.

Thereafter, a resist 210 is formed on the fourth insulating film 108*a* such that the resist 210 is separated by the opening 107*h* using the photolithography method (see FIG. 5D), and dry etching is then performed thereon. In this manner, the contact hole CH2 that penetrates through the fourth insulating film 108*a* and the third insulating film 106 is formed on an inner side of the opening 107*a* (see FIG. 5E).

Figure 5F:
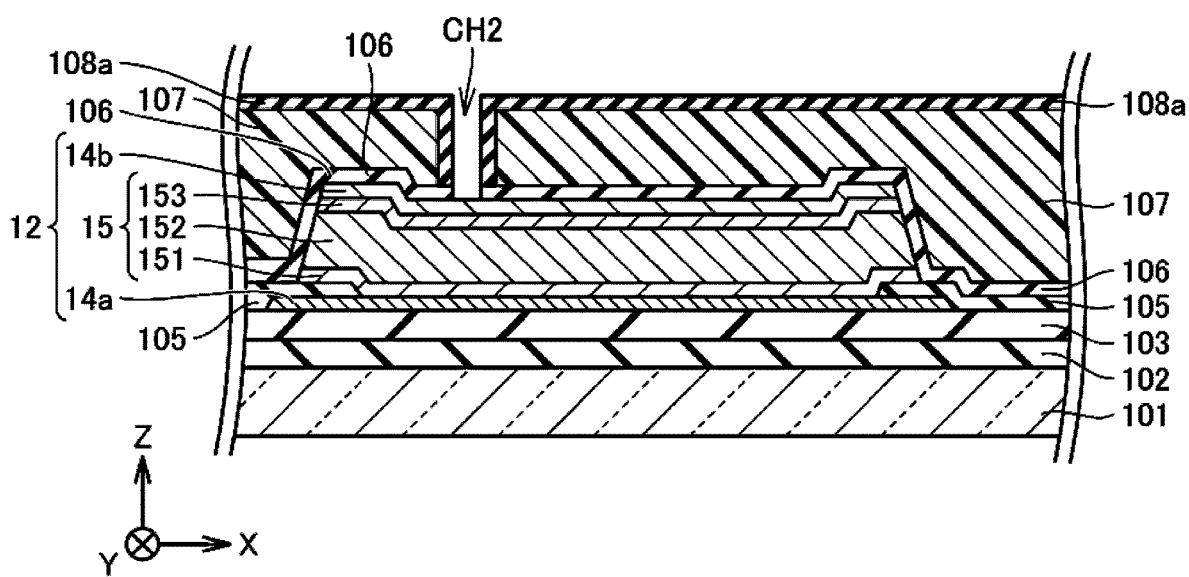
FIG. 5F is a sectional view illustrating a state in which the resist in FIG. 5E has been removed.

After the contact hole CH2 is formed, the resist 210 is removed (see FIG. 5F). Next, the respective metal films 161 of titanium (Ti), aluminum (Al), and titanium (Ti) are created in this order such that the metal films 161 cover the fourth insulating film 108*a* using a sputtering method, and the transparent conductive film 162 made of indium tin oxide (ITO) is then created (see FIG. 5G).

Then, photolithography and dry etching are performed thereon, thereby patterning the metal film 161 and the transparent conductive film 162. At this time, etching gas containing chlorine gas ($Cl_2$) is used for dry etching. In this manner, the bias wire 16 connected to the upper electrode 14*b* via the contact hole CH2 is formed on the fourth insulating film 108*a* (see FIG. 5H).

After the bias wire 16 is formed, the fifth insulating film 109 made of silicon nitride (SiNx) is created such that the fifth insulating film 109 covers the bias wire 16 using the CVD method. Then, the planarizing film 110 made of a photosensitive acrylic resin is formed on the fifth insulating film 109 using the slit coating method (see FIG. 5I). In this manner, the active matrix substrate 1*a* is formed.

The fourth insulating film 108*a* made of silicon nitride (SiNx) is provided between the bias wire 16 and the planarizing film 107. The fourth insulating film 108*a* has higher durability against chlorine etching gas than the planarizing film 107, and the surface of the fourth insulating film 108*a* is unlikely to be damaged even if the dry etching is performed when the bias wire 16 is formed. Therefore, a step difference or the like is unlikely to be generated between the fifth insulating film 109 and the fourth insulating film 108*a* at an end of the bias wire 16 as compared with a case in which the fourth insulating film 108*a* is not provided, and higher covering properties of the bias wire 16 are achieved. That is, the fourth insulating film 108*a* functions as a protective film that protects the planarizing film 107 from the etching gas for the dry etching performed when the bias wire 16 is formed. As a result, water is unlikely to enter the planarizing film 107 from the portion at which the bias wire 16 is formed, water is inhibited from invading the photodiode 12 provided below the planarizing film 107, and a leaking current of the photodiode 12 is unlikely to flow.

(Operations of X-Ray Image Capturing Device 100)

Here, operations of the X-ray image capturing device 100 illustrated in FIG. 1 will be described. First, an X-ray is emitted from the X-ray source 3. At this time, the control unit 2 applies a prescribed voltage (bias voltage) to the bias wire 16 (see FIG. 3 and the like). The X-ray emitted from the X-ray source 3 is transmitted through the object S and is then incident on the scintillator 1*b*. The X-ray that has been incident on the scintillator 1*b* is converted into fluorescent light (scintillation light), and the scintillation light is incident on the active matrix substrate 1*a*. If the scintillation light is incident on the photodiode 12 provided at each pixel on the active matrix substrate 1*a*, the scintillation light is changed into an electrical charge in accordance with the light amount by the photodiode 12. A signal in accordance with the electrical charge converted by the photodiode 12 is read by the signal reading unit 2B (see FIG. 2 and the like) through the source wire 10 when the TFT 13 (see FIG. 3 and the like) is in the ON state in accordance with a gate voltage (positive voltage) output from the gate control unit 2A via the gate wire 11. Then, an X-ray image in accordance with the read signal is generated by the control unit 2.

Modification Example 1 of First Embodiment

Although the example in which only the single fourth insulating film 108a is provided as a protective film between the planarizing film 107 and the bias wire 16 has been described in the aforementioned first embodiment, a configuration in which a two-layered inorganic insulating film is provided may be employed.

Figure 6:
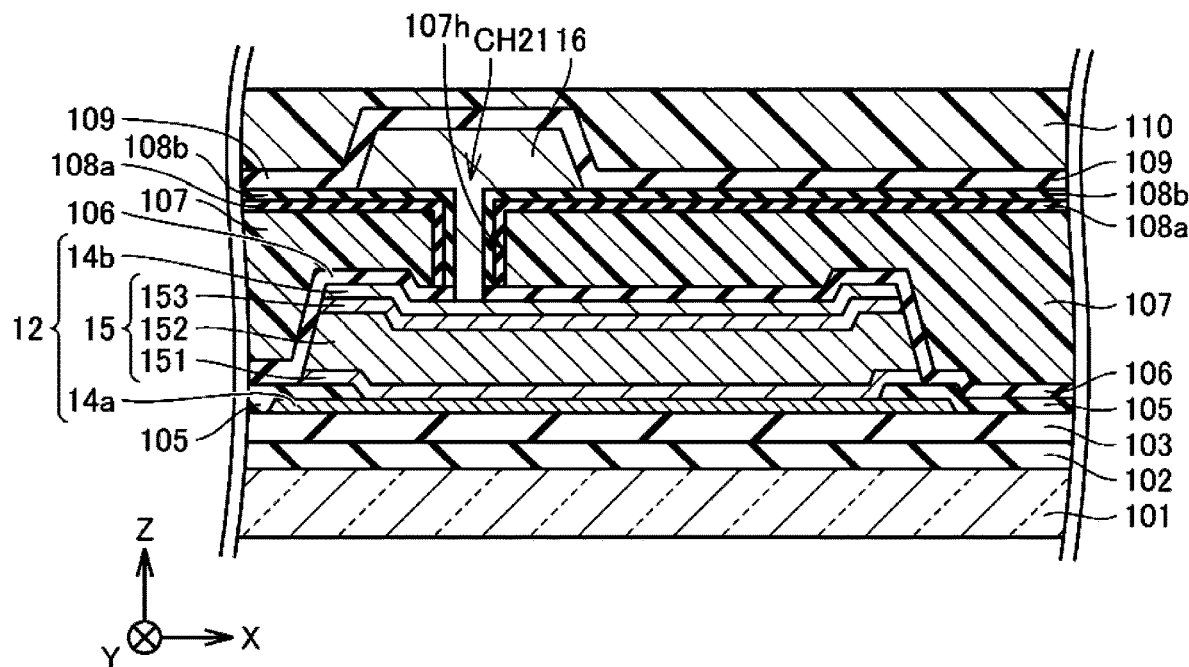
FIG. 6 is an outline sectional view of a pixel according to a modification example 1 of the first embodiment.

FIG. 6 is an outline sectional view of a pixel P1 according to the modification example. FIG. 6 is a sectional view of the pixel P1 illustrated in FIG. 3 taken along the line A-A similarly to FIG. 4. Note that the same reference numerals as those in the first embodiment are used to denote configurations the same as those in the first embodiment in FIG. 6. Hereinafter, configurations that are different from those in the first embodiment will be mainly described.

As illustrated in FIG. 6, the fourth insulating film 108a and an inorganic insulating film 108b are laminated as protective films that cover the planarizing film 107. In the modification example, the fourth insulating film 108a will be referred to as a lower layer-side fourth insulating film, and the inorganic insulating film 108b will be referred to as an upper layer-side fourth insulating film in these two layers.

In this case, a contact hole CH21 that penetrates through the lower layer-side fourth insulating film 108a and the upper layer-side fourth insulating film 108b is formed in these insulating films at a position at which the contact hole CH21 overlaps with the upper electrode 14b in plan view, and both the lower layer-side fourth insulating film 108a and the upper layer-side fourth insulating film 108b are separated by the contact hole CH21.

The upper layer-side inorganic insulating film 108b is made of silicon oxide (SiO$_2$) in this example. In this case, both the film thicknesses of the lower layer-side fourth insulating film 108a and the upper layer-side fourth insulating film 108b are preferably about 150 nm.

In this manner, the two-layered inorganic insulating film is provided as a protective film that protects the planarizing film 107 in the modification example. Therefore, the planarizing film 107 is more unlikely to undergo etching damage due to the dry etching performed when the bias wire 16 is formed as compared with the case in which only the lower layer-side fourth insulating film 108a is provided. In addition, a selection ratio of the upper layer-side fourth insulating film 108b with respect to the dry etching performed when the bias wire 16 is formed is higher than that of the lower layer-side fourth insulating film 108a, and the upper layer-side fourth insulating film 108b has higher durability against the dry etching than the lower layer-side fourth insulating film 108a. Therefore, adhesiveness between the fifth insulating film 109 and the protective film (upper layer-side fourth insulating film 108b) is enhanced, and it is possible to further inhibit water from invading the planarizing film 107 from the portion at which the bias wire 16 is formed as compared with the first embodiment in which only the lower layer-side fourth insulating film 108a is provided.

Modification Example 2 of First Embodiment

In the aforementioned first embodiment, the example in which the scintillator 1b is provided on the planarizing film 110 provided on the uppermost layer of the active matrix substrate 1a has been described. Since the planarizing film 110 is formed from an organic insulating film made of a photosensitive acrylic resin, water is likely to enter the planarizing film 110 in a high-temperature environment, in particular. In the modification, a configuration in which water is unlikely to enter the planarizing film 110 will be described.

Figure 7:
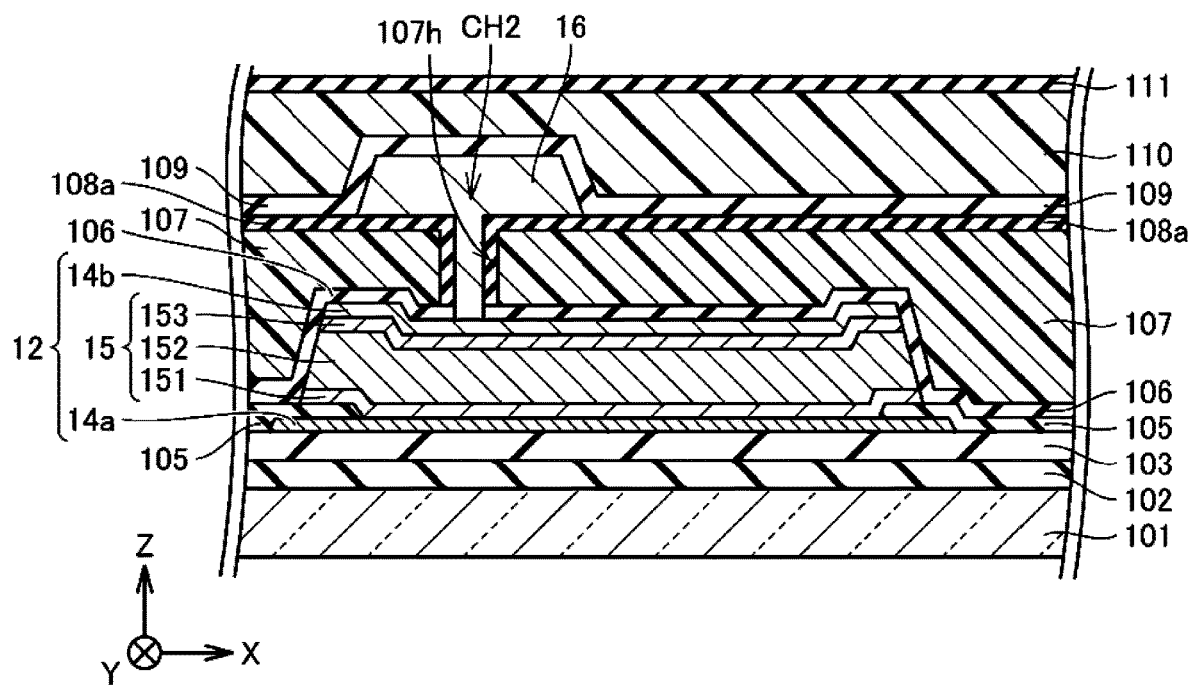
FIG. 7 is an outline sectional view of a pixel according to a modification example 2 of the first embodiment.

FIG. 7 is an outline sectional view of the pixel P1 according to the modification example. FIG. 7 is a sectional view of the pixel P1 according to the modification example. Note that the same reference numerals as those in the first embodiment are used to denote configurations the same as those in the first embodiment in FIG. 7. Hereinafter, configurations that are different from those in the first embodiment will be mainly described.

As illustrated in FIG. 7, the active matrix substrate 1a according to the modification example is provided with a protective film 111 that covers the planarizing film 110. The protective film 111 is formed from an inorganic insulating film made of silicon nitride (SiNx) in this example. The film thickness of the protective film 111 is preferably about 150 nm, for example.

In this manner, water is unlikely to enter the planarizing film 110, and the effect of inhibiting water from invading the photodiode 12 is further enhanced by covering the upper surface of the planarizing film 110 with the protective film 111 formed from the inorganic insulating film.

Note that although the configuration in which the protective film 111 is provided in the configuration according to the first embodiment has been described in the modification example, the protective film 111 may be provided on the planarizing film 110 (see FIG. 6) according to the aforementioned modification example 1.

Second Embodiment

In the aforementioned first embodiment, the example in which the protective films (108a and 108b) formed from the inorganic insulating films are provided between the planarizing film 107 and the bias wire 16 in order to inhibit water from invading the planarizing film 107 has been described. In this embodiment, a configuration that exhibits a higher effect of inhibiting water invasion than that in the first embodiment will be described.

Figure 8A:
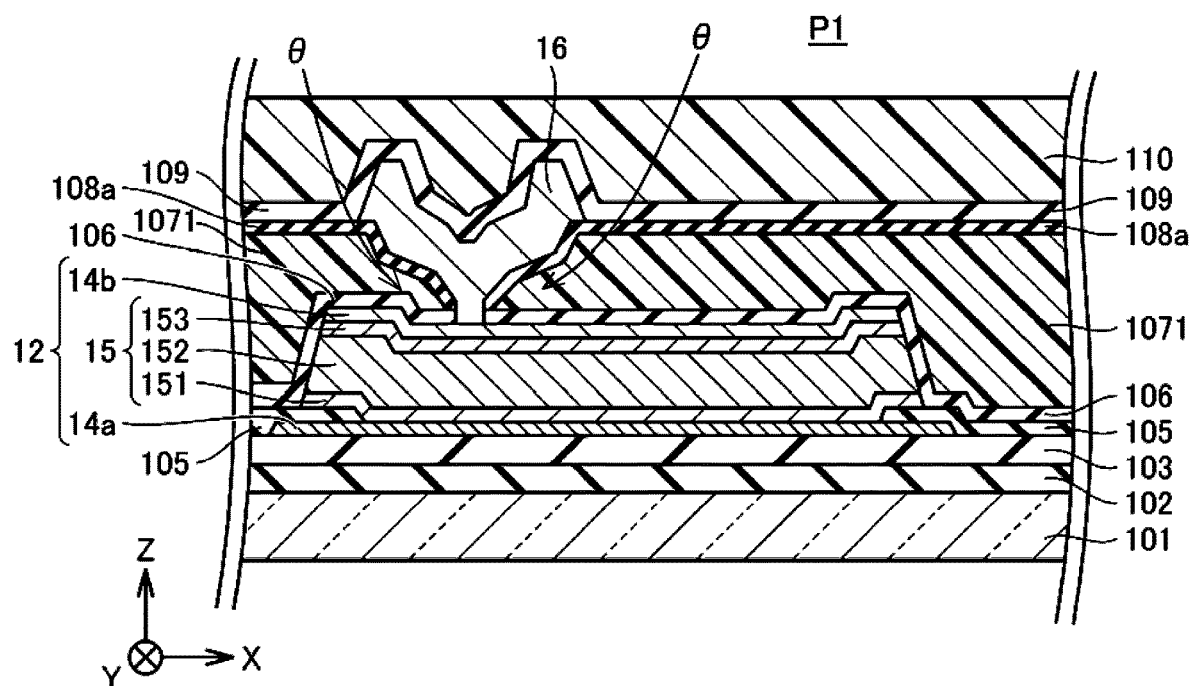
FIG. 8A is an outline sectional view of a pixel according to a second embodiment.
Figure 8B:
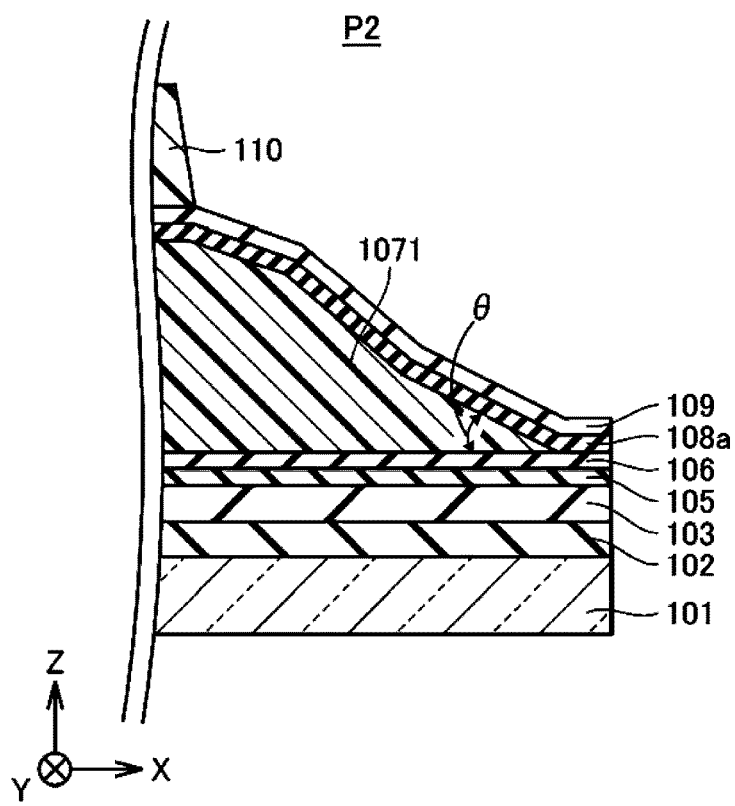
FIG. 8B is an outline sectional view of an end of an active matrix substrate according to the second embodiment.

FIG. 8A is an outline sectional view of the pixel P1 according to the embodiment. In addition, FIG. 8B is an outline sectional view of an end (hereinafter, referred to as a substrate end P2) of the active matrix substrate 1a according to the embodiment.

As illustrated in FIG. 8A, a taper angle θ of a planarizing film 1071 at the contact hole CH2 is equal to or greater than 15° and equal to or less than 25° with respect to the surface of the third insulating film 106 in the embodiment. Further, a taper angle θ of the planarizing film 1071 at the substrate end P2 is equal to or greater than 15° and equal to or less than 25° with respect to the surface of the third insulating film 106 in the embodiment as illustrated in FIG. 8B. Note that the taper angle is an angle between the planarizing film 1071 and the surface of the third insulating film 106, and the portion on the surface of the planarizing film 1071 at which the taper angle θ is equal to or less than 25° will be referred to as a tapered portion. Note that although the surface of the tapered portion of the planarizing film 1071 is folded in the drawing, the surface of the tapered portion of the planarizing film 1071 may be smoothly inclined such that the taper angle θ is equal to or less than 25°.

As described above, the contact hole CH2 and the region of the substrate end P2 are required to have larger areas than those in the first embodiment for setting the taper angles of the planarizing film 1071 at the contact hole CH2 portion and at the substrate end P2 to be equal to or greater than 15° and equal to or less than 25°. However, the inventors have introduced that the effect of inhibiting water from invading the planarizing film 1071 is enhanced with such a configuration as compared with that in the first embodiment. Hereinafter, the reason thereof will be described in a specific manner.

Figures 8C, 8D:
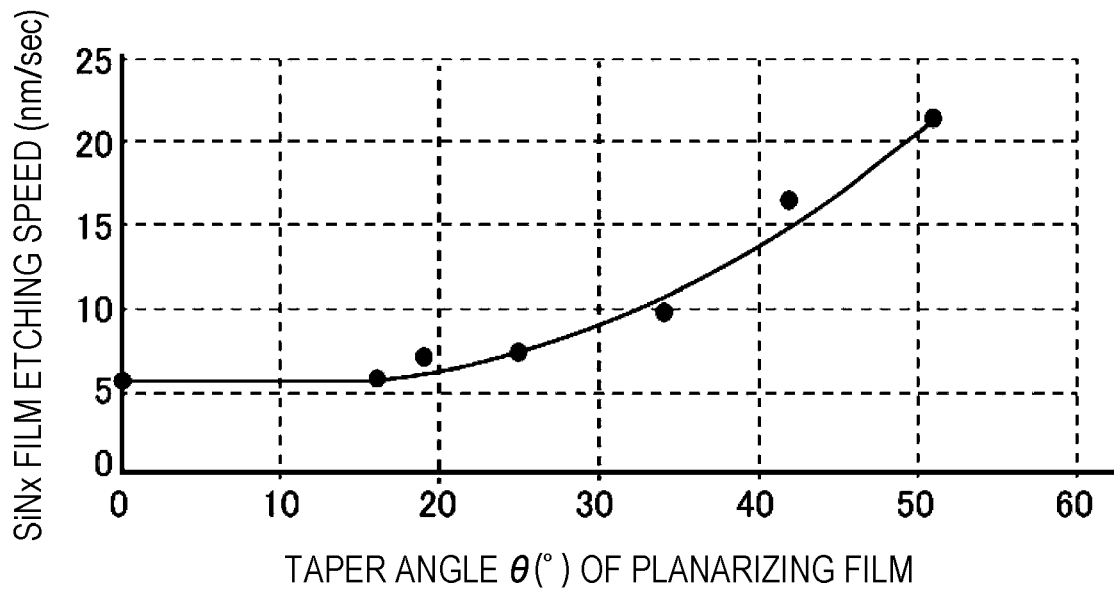
FIG. 8C is a graph illustrating a relationship between a taper angle of a planarizing film 1071 illustrated in FIG. 8A and a speed of etching of a fourth insulating film 108a with a hydrofluoric acid.
FIG. 8D is a table illustrating a taper angle of the planarizing film 1071 and reliability evaluation of the image capturing panel based on the result in FIG. 8C.

FIG. 8C is a graph illustrating a result of changing the taper angle θ of the planarizing film 1071 and measuring a speed (nm/sec) of etching of the fourth insulating film 108a, which is a silicon nitride (SiNx) film on the planarizing film 1071, with a hydrofluoric acid.

As illustrated in FIG. 8C, the speed of etching the silicon nitride film increases as the taper angle θ of the planarizing film 1071 increases. Although the etching speed is substantially similar when the taper angle θ ranges from 0° to 25°, in particular, the etching speed exponentially increases when the taper angle θ is equal to or greater than 25°. The etching speed relates to a film density of the fourth insulating film 108a. That is, a portion at which the film density of the fourth insulating film 108a is smaller is more likely to be etched, and the etching speed thereof increases.

As illustrated in FIG. 8C, the speed of etching the silicon nitride film changes in accordance with the taper angle θ of the planarizing film 1071. That is, the film density of the fourth insulating film 108a created on the planarizing film 107 changes in accordance with the taper angle θ of the planarizing film 1071. This is because the silicon nitride film is unlikely to be created uniformly as the taper angle increases at the tapered portion that is inclined with respect to the substrate although the silicon nitride film is created uniformly at a portion at which the planarizing film 1071 is horizontal with respect to the substrate, in a case in which the silicon nitride film is created on the planarizing film 1071 using the CVD method.

Since water is likely to enter the portion, in which the film density is small, of the fourth insulating film 108a and reliability of the active matrix substrate 1a is degraded, the film density of the fourth insulating film 108a is preferably as high as possible. FIG. 8D is a result obtained by the inventors evaluating, in three levels, reliability of the active matrix substrate 1a with respect to the taper angle of the planarizing film 1071 mainly at the substrate end P2 on the basis of the aforementioned measurement result in FIG. 8C. In FIG. 8D, evaluation of reliability is represented with ◯, Δ, × in an order from the highest reliability.

As illustrated in FIG. 8D, the evaluation of reliability of the active matrix substrate 1a is the highest when the taper angle θ of the planarizing film 1071 is equal to or less than 25°, and the evaluation of reliability of the active matrix substrate 1a is the lowest in a range in which the taper angle θ is 40°<θ≤60°. That is, if the taper angle of the planarizing film 1071 with respect to the third insulating film 106 is equal to or less than 25°, the film density of the fourth insulating film 108a formed on the inclined surface (tapered portion) of the planarizing film 1071 is substantially similar to the film density of the fourth insulating film 108a formed on a flat portion of the planarizing film 1071, and water is unlikely to invade the planarizing film 1071 via the fourth insulating film 108a.

Although it is sufficient for the taper angle of the planarizing film 1071 to be equal to or less than 25° in order for the fourth insulating film 108a to be substantially uniformly formed as described above, the lower limit value of the taper angle of the planarizing film 1071 is preferably about 15° in consideration of restriction, such as the size of the contact hole CH2 in the pixel, applied when the active matrix substrate 1a is manufactured.

Here, a method for manufacturing the active matrix substrate 1a according to the embodiment will be described. Hereinafter, a manufacturing process that is different from that in the first embodiment will be mainly described.

FIGS. 9A to 9F are sectional views illustrating a process for manufacturing the active matrix substrate 1a according to the embodiment, and in particular, a sectional view illustrating a process for producing the planarizing film 1071 at the pixel P1 and the substrate end P2. Note that one active matrix substrate 1a is obtained by dividing one substrate. Therefore, the sectional portion represented as P2 in FIGS. 9A to 9F illustrates a section of ends of two adjacent active matrix substrate regions before a substrate is divided, and the broken line C illustrates a dividing position of the substrate, that is, a boundary of the two active matrix substrate regions.

First, the gate insulating film 102 and the first insulating film 103 are formed in this order over entire one surface of the substrate 101, similarly to the first embodiment, as illustrated in FIG. 9A. Thereafter, the TFT 13 (not illustrated) and the photodiode 12 are formed in the region of the pixel P1, a photolithography method and wet etching are performed thereon, and the second insulating film 105 is formed on the first insulating film 103 such that the second insulating film 105 is separated from the first insulating film 103 on the lower electrode 14a of the photodiode 12. Next, the third insulating film 106 made of silicon nitride (SiNx) is created on the second insulating film 105 such that the third insulating film 106 covers the entire photodiode 12, and a photosensitive acrylic resin film 1070 is then formed such that the photosensitive acrylic resin film 1070 covers the third insulating film 106.

Next, the photosensitive acrylic resin film 1070 is patterned using the photolithography method. Specifically, a halftone mask is used as a photomask in an exposure process. As illustrated in FIG. 9B, the halftone mask 200 is formed such that a translucent film 211 with light transmittance of about 10 to 70% and a light blocking film 212 that does not allow light to be transmitted therethrough are disposed on a glass substrate 210, for example. In the halftone mask 200, the light blocking film 212 has an opening 212a. The opening 212a of the light blocking film 212 overlaps with the contact hole CH2 on the substrate 101 or the dividing position C at the timing of exposure in plan view. In the halftone mask 200, the translucent film 211 is provided at a partial region that overlaps with the opening 212a portion in plan view. In the region in which only the translucent film 211 is provided, the amount of irradiation light in exposure is relatively smaller than that in the opening 211a region. Therefore, the photosensitive acrylic resin film 1070 is patterned in accordance with the amount of irradiation, and the film thickness of the photosensitive acrylic resin film 1070 portion corresponding to the opening 212a becomes thinner than those of the other regions, through performing a developing process after the exposure process.

In this manner, the taper angle of the planarizing film 1071 at the contact hole CH2 and the substrate end P2 becomes equal to or greater than 15° and equal to or less than 25°, and the opening 1071a is formed by patterning the photosensitive acrylic resin film 1070 using the halftone mask 200 and forming the planarizing film 1071.

Figure 9C:
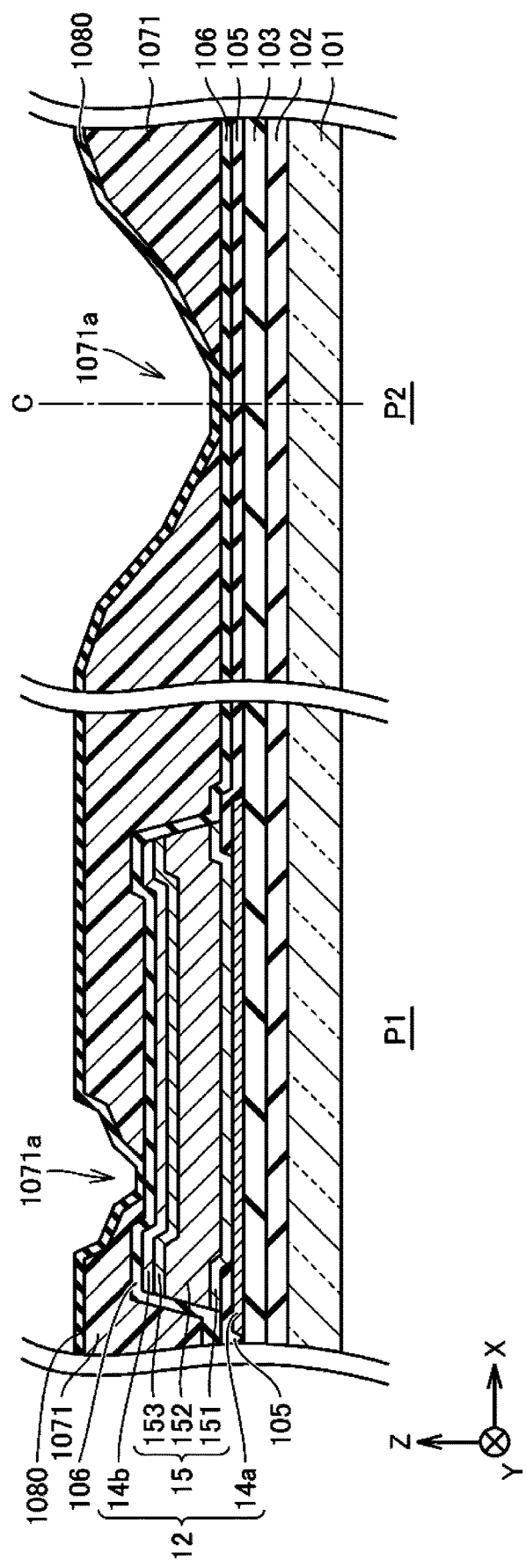
FIG. 9C is a sectional view illustrating a process for creating a fourth insulating film on the planarizing film in FIG. 9B.
Figure 9D:
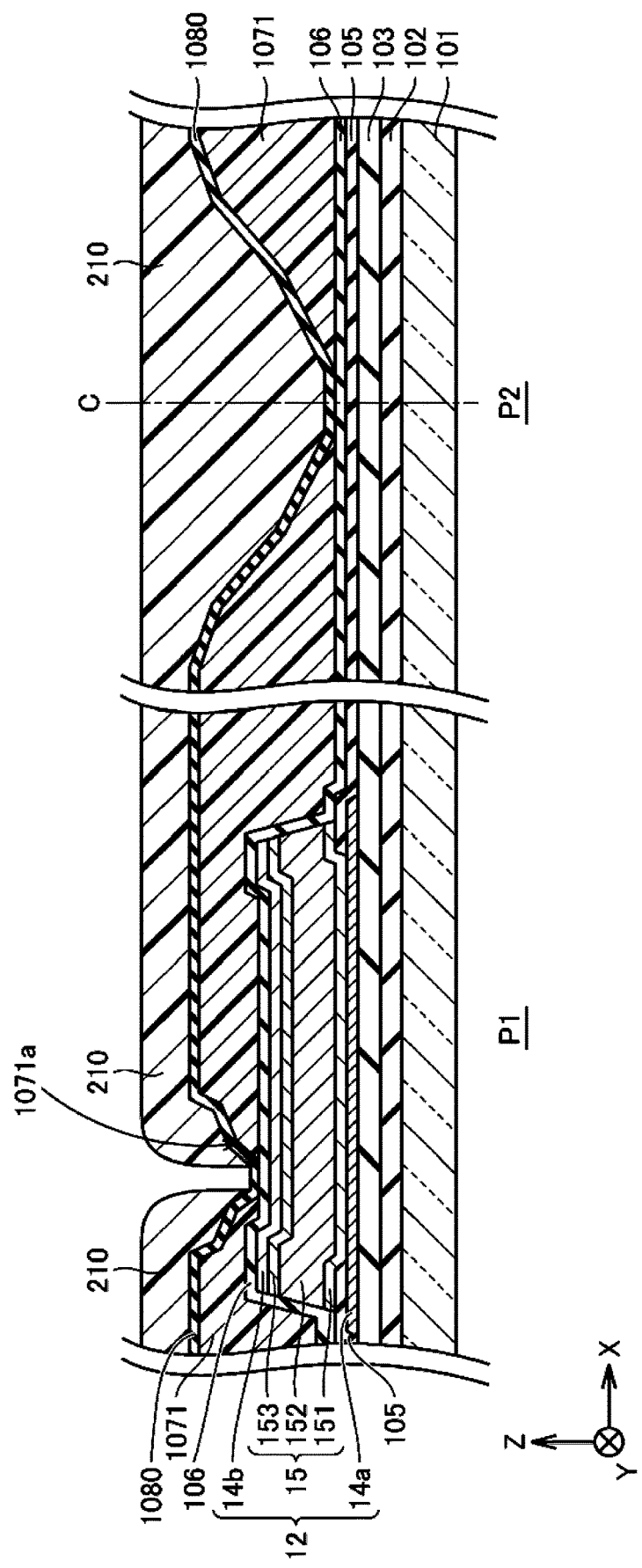
FIG. 9D is a sectional view illustrating a process for forming a resist on the fourth insulating film in FIG. 9C.
Figure 9E:
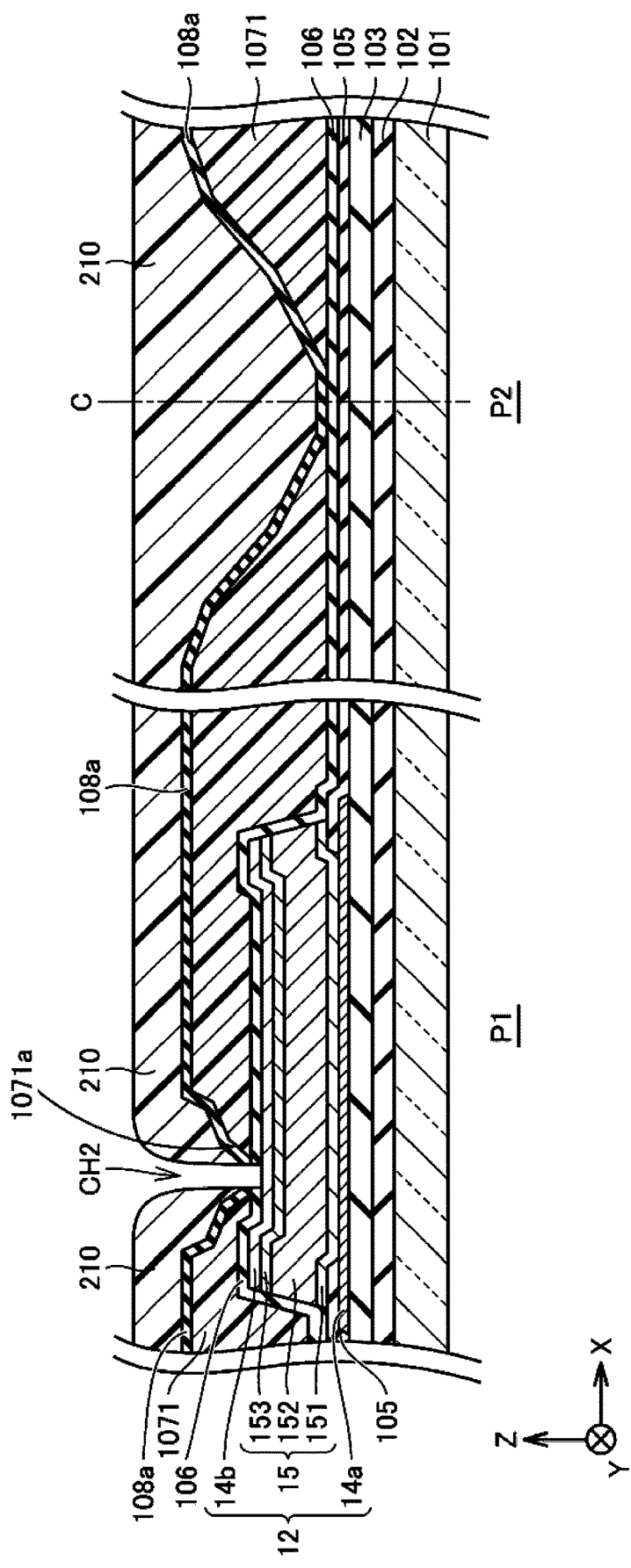
FIG. 9E is a sectional view illustrating a process for forming a contact hole that penetrates through the fourth insulating film in FIG. 9D and a third insulating film.
Figure 9F:
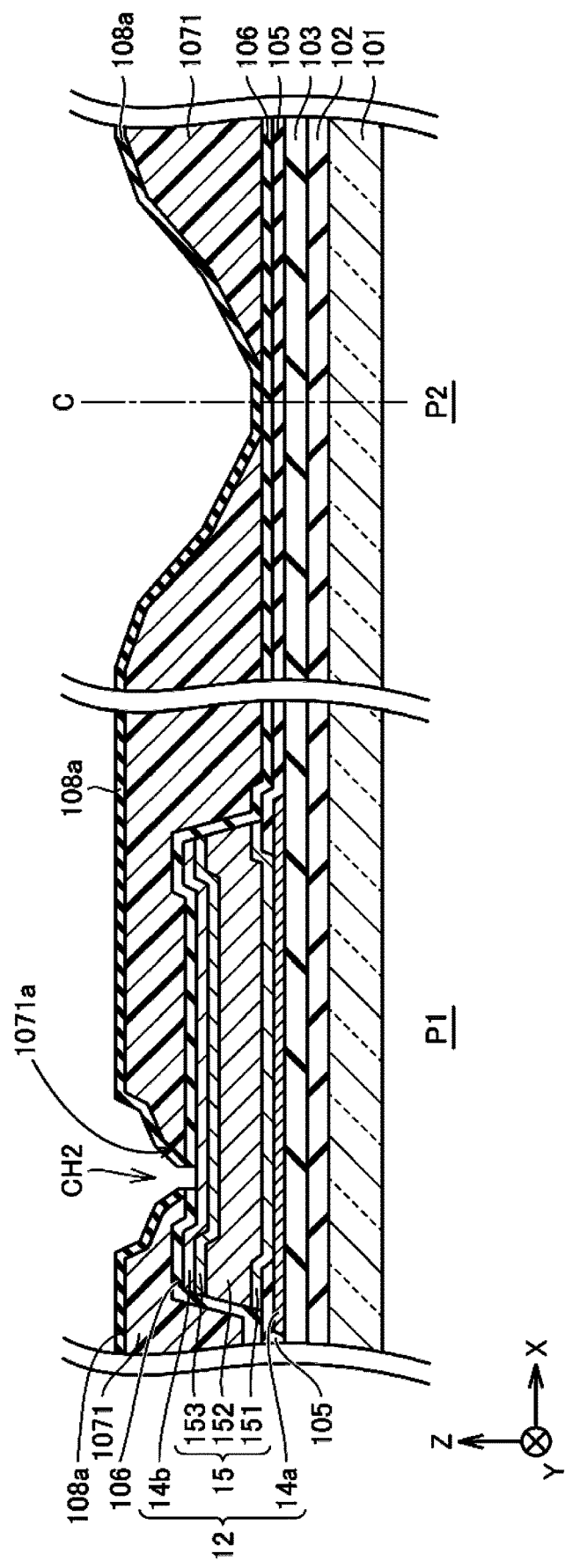
FIG. 9F is a sectional view illustrating a state in which the resist in FIG. 9E has been removed.

Next, a silicon nitride (SiNx) film 1080 is created on the planarizing film 1071 using the CVD method (see FIG. 9C). Thereafter, the resist 210 is formed such that the resist 210 is separated by the opening 1071a of the pixel P1 and such that the resist 210 covers the silicon nitride (SiNx) film 1080 by using the photolithography method (see FIG. 9D). Then, dry etching is performed using chlorine-based gas (see FIG. 9E). In this manner, the fourth insulating film 108a is formed, and the contact hole CH2 that penetrates through the fourth insulating film 108a and the third insulating film 106 is formed on an inner side of the opening 1071a of the pixel P1.

Figure 5G:
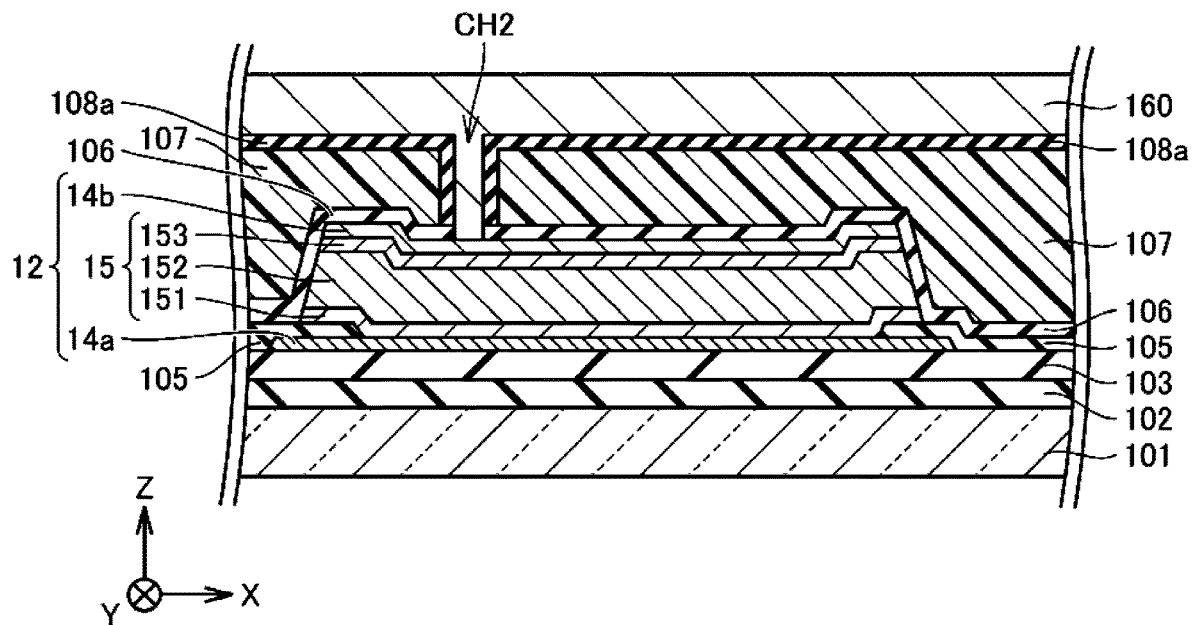
FIG. 5G is a sectional view illustrating a process for forming a metal film as a bias wire on the fourth insulating film in FIG. 5F.
Figure 5H:
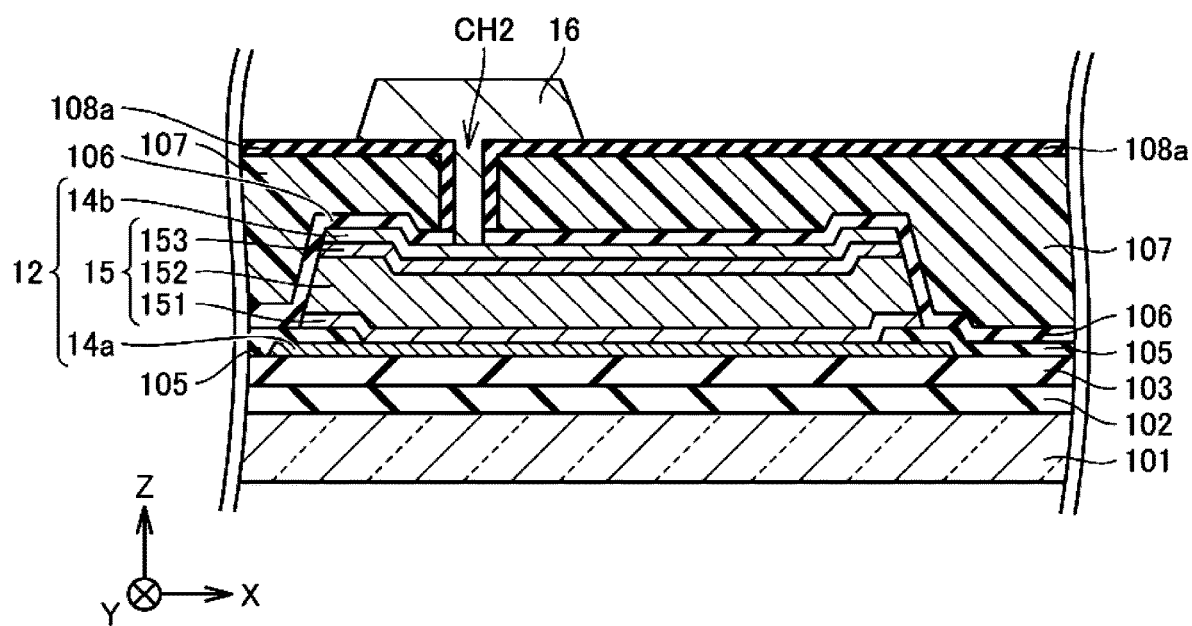
FIG. 5H is a sectional view illustrating a process for forming the bias wire by patterning the metal film in FIG. 5G.
Figure 5I:
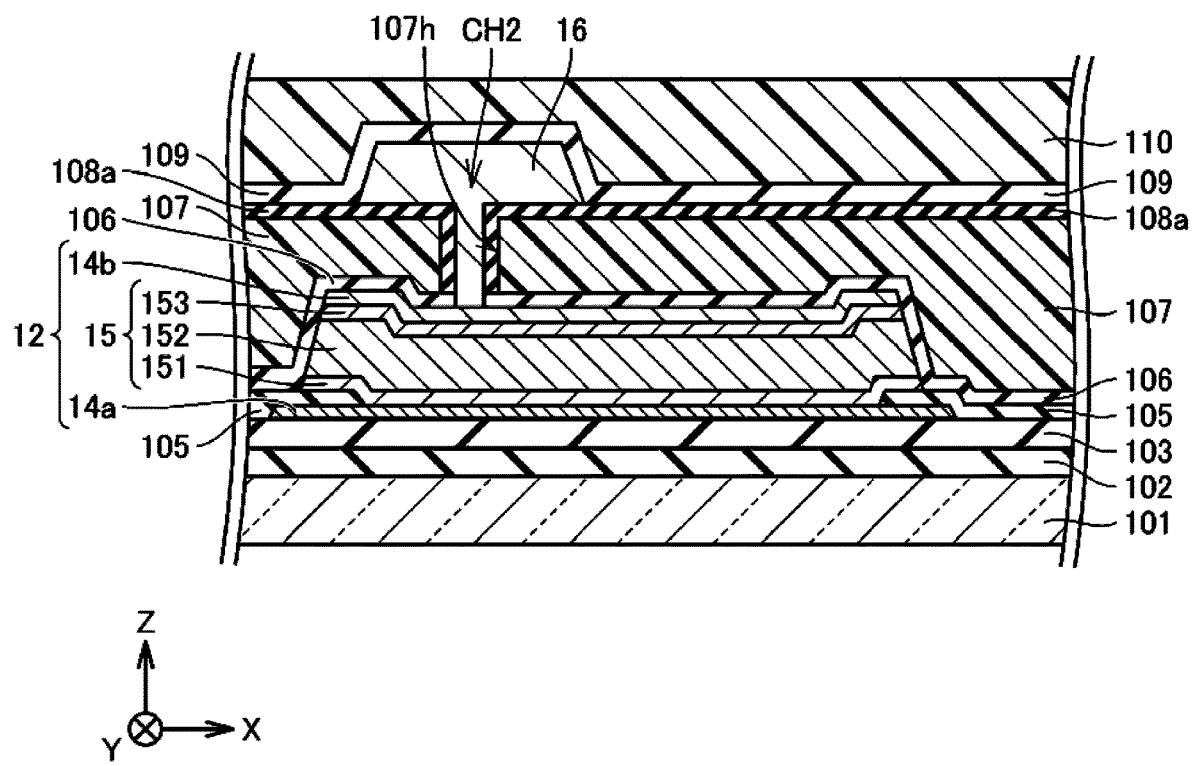
FIG. 5I is a sectional view illustrating a process for forming a fifth insulating film that covers the bias wire in FIG. 5H and a planarizing film.

Thereafter, the resist 210 is removed (see FIG. 9F), the same processes as those in FIGS. 5G to 5I in the aforementioned first embodiment are then performed, and the substrate is divided at the dividing position C, thereby producing one active matrix substrate 1a that has the pixel P1 illustrated in FIG. 8A and the substrate end P2 illustrated in FIG. 8B. That is, the one active matrix substrate 1a has a pixel region in which a plurality of structures of the pixel P1 illustrated in FIG. 8A is formed on the substrate and structures of the substrate end P2 illustrated in FIG. 8B at the respective sides of the substrate.

Third Embodiment

Although the exemplary case in which the taper angles of the planarizing film 1071 at the pixel P1 and the substrate end P2 on the active matrix substrate 1a are equal to or less than 25° has been described in the aforementioned second embodiment, it is sufficient for the taper angle of the planarizing film 1071 at least one of the regions to be equal to or less than 25°. The substrate end P2 of the active matrix substrate 1a is more lightly to be exposed to external air than the pixel P1. In addition, the size of the contact hole CH2 of one pixel P1 in the active matrix substrate 1a is more likely to be restricted than the substrate end P2. Therefore, the taper angle of the planarizing film 1071 at least at the substrate end P2 is preferably equal to or less than 25°. That is, the taper angle of the planarizing film at the contact hole CH2 portion in the pixel P1 may be configured to be substantially vertical with respect to the third insulating film 106 in this case as in the first embodiment. Since the planarizing film 1071 at the substrate end P2 is covered with the fourth insulating film 108a that is formed to be substantially uniform even with such a configuration, water is inhibited from invading the planarizing film 1071 at the substrate end P2 that is likely to be exposed to external air.

Note that the sectional configuration at the substrate end P2 is not limited to the configuration in the aforementioned second embodiment, and configurations described below may also be employed.

Figure 10A:
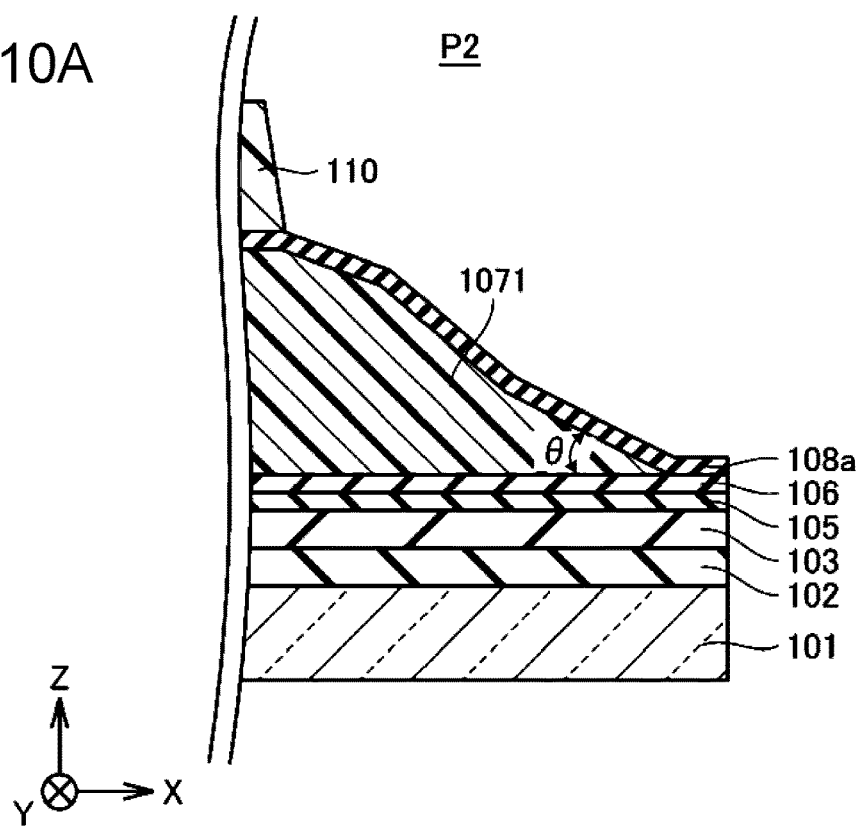
FIG. 10A is a sectional view illustrating an outline configuration of a substrate end of an active matrix substrate according to a third embodiment.
Figure 10B:
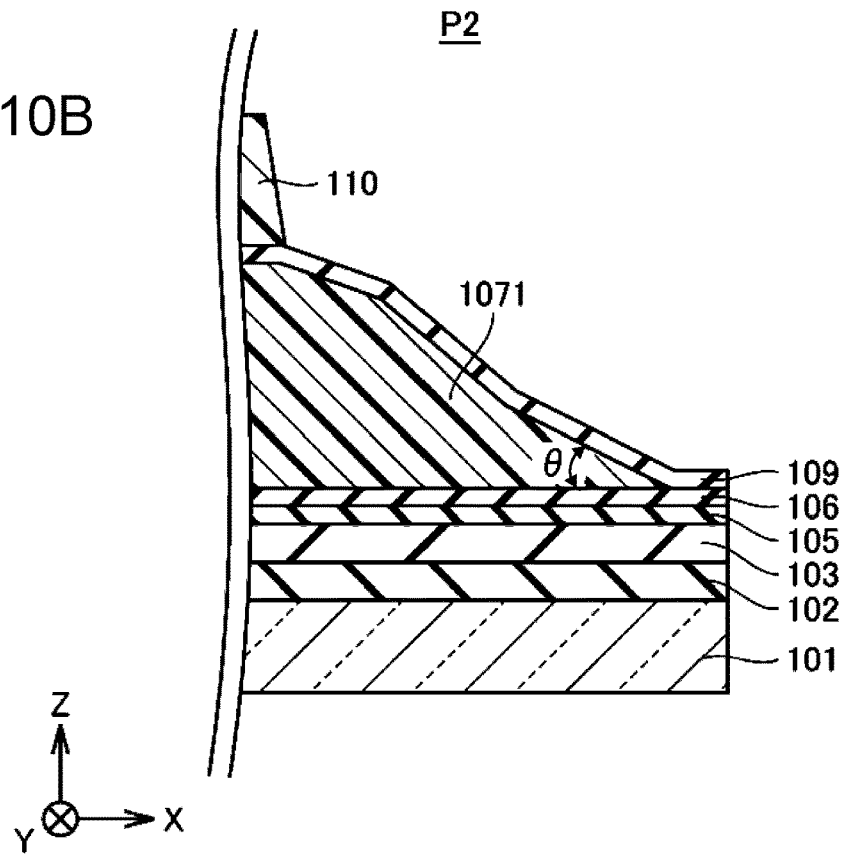
FIG. 10B is a sectional view illustrating an outline configuration of the substrate end of the active matrix substrate according to the third embodiment.

(1) Although in the aforementioned second embodiment, the fourth insulating film 108a and the fifth insulating film 109 are laminated on the planarizing film 1071 at the substrate end P2 (see FIG. 8B), the surface of the planarizing film 1071 may be covered with the inorganic insulating film of at least one of the fourth insulating film 108a and the fifth insulating film 109 as illustrated in FIGS. 10A and 10B, for example. Note that in this case, the fourth insulating film 108a may be provided on the planarizing film 1071 at the pixel P1, and the fifth insulating film 109 may be provided on the fourth insulating film 108a such that the fifth insulating film 109 covers the bias wire 16.

In this example also, the planarizing film 1071 at the substrate end P2 is covered with the fourth insulating film 108a or the fifth insulating film 109 that is formed substantially uniformly. In addition, the planarizing film 1071 at the substrate end P2 is provided between the fourth insulating film 108a or the fifth insulating film 109 that is an inorganic insulating film and the third insulating film 106 that is an inorganic insulating film, and the planarizing film 1071 is not exposed as illustrated in FIG. 10A or 10B. Therefore, water is unlikely to enter the planarizing film 1071 at the substrate end P2, and it is thus possible to inhibit water from invading the pixel P1.

Figure 11:
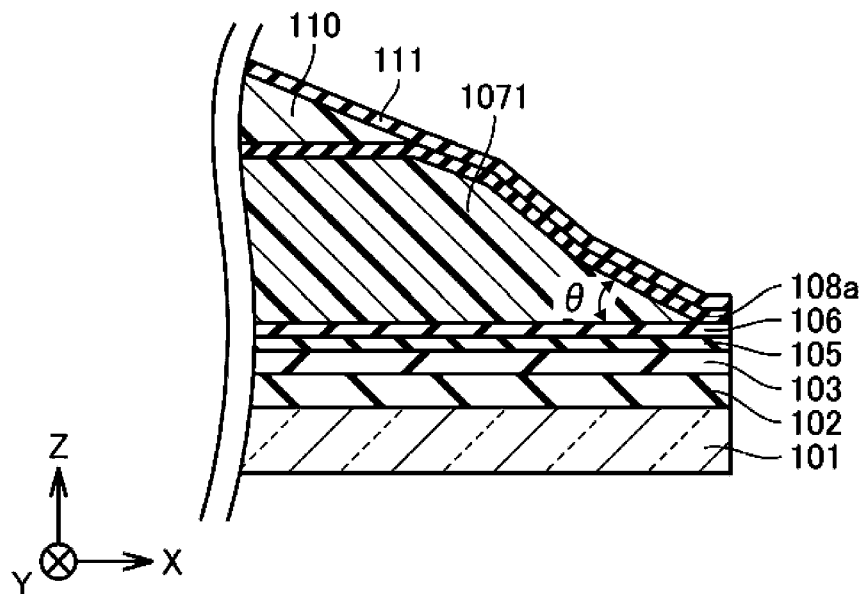
FIG. 11 is a sectional view illustrating an outline configuration of the substrate end of the active matrix substrate according to the third embodiment.

(2) In the modification example 1 of the first embodiment, the planarizing film 1071 may be covered with the fourth insulating film 108a, and the planarizing film 110 and the fourth insulating film 108a may be covered with the protective film 111 as illustrated in FIG. 11, for example, at the substrate end P2 of the active matrix substrate 1a. In this case, the surface of the planarizing film 1071 at the substrate end P2 is covered with the fourth insulating film 108a that is formed substantially uniformly. In addition, the end of the planarizing film 1071 is also covered with the fourth insulating film 108a and is not exposed. Further, since the surface of the planarizing film 110 is covered with the protective film 111, and the end of the planarizing film 110 is also covered with the protective film 111, the planarizing film 110 is not exposed. As described above, the protective film 111 is formed from an inorganic insulating film made of silicon nitride (SiNx). Therefore, water is more unlikely to invade the planarizing film 1071 and the planarizing film 110 at the substrate end P2, and the effect of inhibiting water from invading the pixel P1 is further enhanced as compared with a case in which the protective film 111 is not provided.

Note that the fifth insulating film 109 is provided at the pixel P1 (see FIG. 7) of the active matrix substrate 1a in the modification example 1 of the first embodiment. Therefore, the fourth insulating film 108a may be covered with the fifth insulating film 109 as illustrated in FIG. 8B as described above at the substrate end P2 illustrated in FIG. 11.

Figure 12:
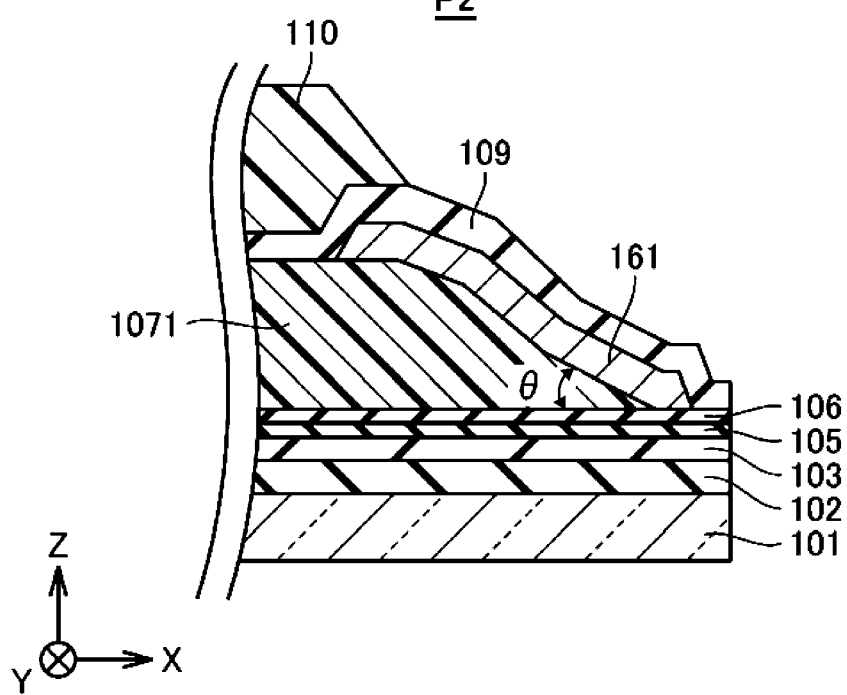
FIG. 12 is a sectional view illustrating an outline configuration of the substrate end of the active matrix substrate according to the third embodiment.

(3) In the first embodiment or the second embodiment, a bias wire layer 161 made of the same material as that of the bias wire 16 may be provided on the inclined surface (tapered portion) of the planarizing film 1071, and the fifth insulating film 109 may be provided such that the fifth insulating film 109 covers the planarizing film 1071 and the bias wire layer 161 as illustrated in FIG. 12, for example, at the substrate end P2 of the active matrix substrate 1a. Note that the inclined surface (tapered portion) of the planarizing film 1071 is a surface with which the planarizing film 1071 forms an acute angle with respect to the surface of the third insulating film 106.

As described above, the inorganic insulating film that is formed at the inclined surface portion of the planarizing film 1071 using the CVD method tends to have lower film density than that of the inorganic insulating film that is formed on the flat portion. With this configuration, the bias wire layer 161 that is a metal film is provided on the inclined surface of the planarizing film 1071, and the fifth insulating film 109 covers the bias wire layer 161 and the planarizing film 1071. Therefore, it is possible to further enhance the effect of inhibiting water from invading the planarizing film 1071 as compared with a case in which the inclined surface portion of the planarizing film 1071 is covered merely with the fifth insulating film 109.

Note that although the example in which the bias wire layer 161 is provided on the inclined surface of the planarizing film 1071 at the substrate end P2 has been described in this example, the metal film provided on the inclined surface of the planarizing film 1071 may be formed from a metal material that is different from that of the bias wire 16.

Figure 13:
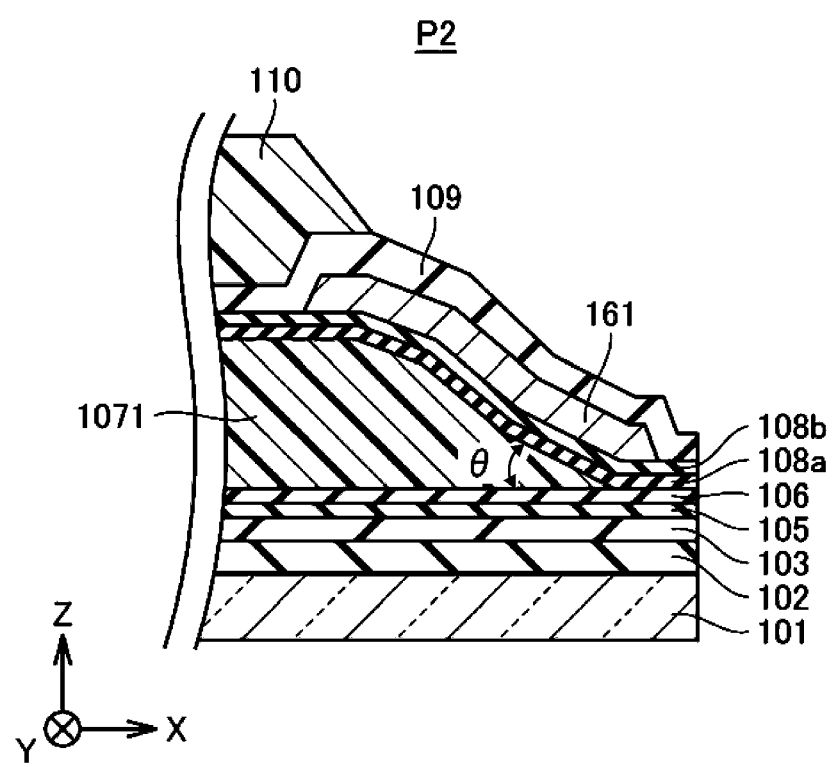
FIG. 13 is a sectional view illustrating an outline configuration of the substrate end of the active matrix substrate according to the third embodiment.

(4) In the above configuration (3), the surface of the planarizing film 1071 may be covered with the protective films (the lower layer-side fourth insulating film 108a and the upper layer-side fourth insulating film 108b) according to the modification example 1 of the first embodiment as illustrated in FIG. 13, for example. That is, the upper layer-side fourth insulating film 108b on the planarizing film 1071 may be covered with the bias wire layer 161, and the bias wire layer 161 and the upper layer-side fourth insulating film 108b may be covered with the fifth insulating film 109. With such a configuration, it is possible to further enhance the effect of inhibiting water from invading the planarizing film 1071 as compared with the above configuration (3).

Note that in FIGS. 12 and 13, the planarizing film 110 and the fifth insulating film 109 may be covered with the protective film 111 similarly to FIG. 11. In this case, the protective film 111 may be provided on the planarizing film 110 at the pixel P1 as well. In addition, the taper angle of the planarizing film 110 is preferably equal to or less than 25° similarly to the planarizing film 1071. With such a configuration, it is possible to substantially uniformly form the protective film 111 on the planarizing film 110 and to enhance the effect of inhibiting water from invading the planarizing film 110.

Although the embodiments of the active matrix substrate and the image capturing panel provided therewith have been described above, the aforementioned embodiments are just illustrative examples. Therefore, the active matrix substrate and the image capturing panel provided therewith are not limited to the aforementioned embodiments, and the aforementioned embodiments can be appropriately modified and performed without departing from the gist thereof.

(1) Although the example in which the surface of the planarizing film 1071 at the pixel P1 is covered with the fourth insulating film 108a has been described in the aforementioned second embodiment, the fourth insulating film 108a may not be provided. However, the planarizing film 1071 at the substrate end P2 is covered with the fifth insulating film 109 in this case. That is, it is sufficient for the surface of the planarizing film 1071 at the substrate end P2 to be covered with at least a single inorganic insulating film. Although the inorganic insulating film is preferably the one provided at the pixel P1 such that the inorganic insulating film extends up to the substrate end P2 but is not limited to the one provided at the pixel P1 such that the inorganic insulating film extends. With such a configuration, water is still inhibited from invading the planarizing film 1071 at the substrate end P2 that is likely to be exposed to external air, and it is possible to inhibit water from invading the pixel P1.

In addition, although the taper angle of the planarizing film 1071 at the contact hole CH2 and/or the substrate end P2 is preferably equal to or less than 25° in the second embodiment, it is sufficient for the taper angle of the planarizing film 1071 to be at least an acute angle. With such a configuration, a difference in film density of the inorganic insulating film formed on the planarizing film 1071 narrows and water is unlikely to enter the planarizing film 1071 as compared with a case in which the taper angle of the planarizing film 1071 is a vertical angle with respect to the substrate.

(3) The planarizing film in the aforementioned embodiments may be made of a positive-type or negative-type photosensitive resin material.

(4) Although the example in which the third insulating film 106 that covers the surface of the photodiode 12 extends up to the end of the substrate has been described in the aforementioned first embodiment, it is sufficient for the third insulating film 106 to be provided at least at the pixel portion P1 in the first embodiment.

Note that the aforementioned active matrix substrate and the image capturing panel provided therewith can be described as follows.

An active matrix substrate according to a first configuration includes: a substrate; a photoelectric conversion element provided on the substrate; a first inorganic insulating film that covers a surface of the photoelectric conversion element; a first planarizing film that covers the first inorganic insulating film; and a second inorganic insulating film provided on a side of the first planarizing film opposite to the first inorganic insulating film, in which the first planarizing film, the first inorganic insulating film, and the second inorganic insulating film are provided up to an end of the substrate, the first planarizing film has a tapered portion at the end of the substrate, and an angle between the tapered portion and a surface of the first inorganic insulating film is an acute angle, and the second inorganic insulating film covers the first planarizing film at the end of the substrate.

According to the first configuration, the photoelectric conversion element is covered with the first inorganic insulating film on the substrate, the first inorganic insulating film is covered with the first planarizing film, and the second inorganic insulating film is provided on the side of the first planarizing film opposite to the first inorganic insulating film. The first planarizing film, the first inorganic insulating film, and the second inorganic insulating film are provided up to the end of the substrate, and the first planarizing film at the end of the substrate has the tapered portion that forms an acute angle with respect to the first inorganic insulating film, and the first planarizing film at the end of the substrate is covered with the second inorganic insulating film.

The second inorganic insulating film is more unlikely to be formed uniformly on the first planarizing film, and film density does not become uniform, as the angle between the tapered portion of the first planarizing film at the end of the substrate and the surface of the first inorganic insulating film increases. Water is likely to penetrate through the portion of the second inorganic insulating film at which film density is low, in particular, and water is likely to enter the first planarizing film. Since the tapered portion of the first planarizing film in the first configuration forms an acute angle with respect to the surface of the first inorganic insulating film, the second inorganic insulating film is more likely to be formed uniformly, and water is unlikely to enter the first planarizing film as compared with a case in which the angle between the tapered portion and the surface of the first inorganic insulating film is a vertical angle with respect to the substrate.

At the end of the substrate in the first configuration, an end of the first planarizing film may be covered with the second inorganic insulating film at the end of the substrate (second configuration).

According to the second configuration, the first planarizing film is not exposed to external air since the end of the first planarizing film at the end of the substrate is covered with the second inorganic insulating film. Therefore, it is possible to further enhance the effect of inhibiting water from invading the first planarizing film as compared with a case in which the end of the first planarizing film is not covered with the second inorganic insulating film.

In the first or second configuration, a bias wire connected to the photoelectric conversion element may be further included, in which the first inorganic insulating film may have a first opening at a position at which the first opening overlaps with the photoelectric conversion element in plan view, the first planarizing film may have a second opening at a position at which the second opening overlaps with the first opening in plan view, the second inorganic insulating film may have a third opening inside the second opening and cover a surface of the first planarizing film, the bias wire may be provided on the second inorganic insulating film at a position at which the bias wire overlaps with the first opening, the second opening, and the third opening in plan view, and an angle between the first planarizing film and the surface of the first inorganic insulating film at the second opening may be an acute angle (third configuration).

According to the third configuration, the first opening, the second opening, and the third opening overlap with each other in plan view, and the photoelectric conversion element and the bias wire are connected to each other at these openings. In the pixel region, the angle between the first planarizing film and the surface of the first inorganic insulating film at the second opening is an acute angle, and the surface of the first planarizing film is covered with the second inorganic insulating film. The second inorganic insulating film is likely to be formed uniformly on the first planarizing film as compared with a case in which the angle between the first planarizing film and the surface of the first inorganic insulating film at the second opening is a vertical angle with respect to the substrate. As a result, water is unlikely to enter the first planarizing film not only at the end of the substrate but also at the second opening, and the effect of inhibiting water from invading the active matrix substrate is enhanced.

In any of the first to third configurations, a third inorganic insulating film that covers the bias wire and the second inorganic insulating film may be further included (fourth configuration).

According to the fourth configuration, the third inorganic insulating film covers the bias wire and the second inorganic insulating film. That is, the first planarizing film at the end of the substrate is covered with two inorganic insulating films of the second inorganic insulating film and the third inorganic insulating film. Therefore, it is possible to further enhance the effect of inhibiting water from invading the first planarizing film as compared with a case in which the first planarizing film is covered with one inorganic insulating film.

In any of the first to fourth configurations, a third inorganic insulating film that covers the bias wire and the second inorganic insulating film, a second planarizing film provided on the third inorganic insulating film, and a fourth inorganic insulating film provided on the second planarizing film at least at the end of the substrate may be further included, in which an end of the second planarizing film at the end of the substrate may be covered with the fourth inorganic insulating film (fifth configuration).

According to the fifth configuration, the third inorganic insulating film covers the bias wire and the second inorganic insulating film. In addition, the second planarizing film is provided on the third inorganic insulating film, and the fourth inorganic insulating film is provided on the second planarizing film at the end of the substrate. Since the end of the second planarizing film is covered with the fourth inorganic insulating film at the end of the substrate, the second planarizing film is not exposed to external air, and water is inhibited from invading the second planarizing film. In addition, the first planarizing film at the end of the substrate is covered with two inorganic insulating films, of the second inorganic insulating film and the third inorganic insulating film. Therefore, it is possible to further enhance the effect of inhibiting water from invading the first planarizing film as compared with a case in which the first planarizing film is covered with a single inorganic insulating film.

In any of the first to third configurations, a metal film provided on the tapered portion of the first planarizing film may be further included, in which a surface of the metal film may be covered with the second inorganic insulating film (sixth configuration).

According to the sixth configuration, the tapered portion of the first planarizing film is covered with the metal film, and the first planarizing film and the surface of the metal film are covered with the second inorganic insulating film. Since the tapered portion of the first planarizing film at which film density of the second inorganic insulating film is likely to become low is covered with the metal film, it is possible to further enhance the effect of inhibiting water from invading the first planarizing film.

In the fourth or fifth configuration, a metal film provided on the second inorganic insulating film that covers the tapered portion of the first planarizing film may be further included, in which a surface of the metal film may be covered with the third inorganic insulating film (seventh configuration).

The second inorganic insulating film on the tapered portion of the first planarizing film is likely to have lower film density than that of the second inorganic insulating film formed on a flat portion of the first planarizing film. According to the seventh configuration, the second inorganic insulating film on the tapered portion of the first planarizing film is covered with the metal film, and the surface of the metal film is covered with the third inorganic insulating film. Therefore, it is possible to further enhance the effect of inhibiting water from invading the first planarizing film.

In any of the first to seventh configurations, the acute angle may be equal to or less than 25° (eighth configuration).

According to the eighth configuration, it is possible to more uniformly form the second inorganic insulating film on the first planarizing film and thereby to further enhance the effect of inhibiting water from invading the first planarizing film as compared with a case in which the angle between the tapered portion of the first planarizing film and the surface of the first inorganic insulating film is greater than 25°.

An image capturing panel according to a ninth configuration includes: the active matrix substrate according to any of the first to eighth configurations; and a scintillator that is provided on a surface of the active matrix substrate and converts an X-ray into scintillation light.

According to the ninth configuration, water is inhibited from invading the active matrix substrate, and accuracy in detecting scintillation light can thus be enhanced.

REFERENCE SIGNS LIST

1 IMAGE CAPTURING PANEL
1a ACTIVE MATRIX SUBSTRATE
1b SCINTILLATOR
2 CONTROL UNIT
2A GATE CONTROL UNIT
2B SIGNAL READING UNIT
3 X-RAY SOURCE
10 SOURCE WIRE
11 GATE WIRE
12 PHOTODIODE
13 THIN FILM TRANSISTOR (TFT)
13a GATE ELECTRODE
13b SEMICONDUCTOR ACTIVE LAYER

13c SOURCE ELECTRODE
13d DRAIN ELECTRODE
14a LOWER ELECTRODE
14b UPPER ELECTRODE
15 PHOTOELECTRIC CONVERSION LAYER
16 BIAS WIRE
100 X-RAY IMAGE CAPTURING DEVICE
101 SUBSTRATE
102 GATE INSULATING FILM
103 FIRST INSULATING FILM
105 SECOND INSULATING FILM
106 THIRD INSULATING FILM
107, 110, 1071 PLANARIZING FILM
108a FOURTH INSULATING FILM; LOWER LAYER-SIDE FOURTH INSULATING FILM
108b UPPER LAYER-SIDE FOURTH INSULATING FILM
109 FIFTH INSULATING FILM
151 n-TYPE AMORPHOUS SEMICONDUCTOR LAYER
152 INTRINSIC AMORPHOUS SEMICONDUCTOR LAYER
153 p-TYPE AMORPHOUS SEMICONDUCTOR LAYER
200 HALFTONE MASK

The invention claimed is:

1. An active matrix substrate comprising:
a substrate;
a photoelectric conversion element provided on the substrate;
a first inorganic insulating film that covers a surface of the photoelectric conversion element;
a first planarizing film that covers the first inorganic insulating film; and
a second inorganic insulating film provided on a side of the first planarizing film opposite to the first inorganic insulating film, wherein
the first planarizing film, the first inorganic insulating film, and the second inorganic insulating film are provided up to an end of the substrate,
the first planarizing film has a tapered portion at the end of the substrate, and an angle between the tapered portion and a surface of the first inorganic insulating film is an acute angle, and
the second inorganic insulating film covers the first planarizing film at the end of the substrate.

2. The active matrix substrate according to claim 1, wherein an end of the first planarizing film is covered with the second inorganic insulating film at the end of the substrate.

3. The active matrix substrate according to claim 1, further comprising
a bias wire connected to the photoelectric conversion element, wherein
the first inorganic insulating film has a first opening at a position at which the first opening overlaps with the photoelectric conversion element in plan view,
the first planarizing film has a second opening at a position at which the second opening overlaps with the first opening in plan view,
the second inorganic insulating film has a third opening inside the second opening and covers a surface of the first planarizing film,
the bias wire is provided on the second inorganic insulating film at a position at which the bias wire overlaps with the first opening, the second opening, and the third opening in plan view, and
an angle between the first planarizing film and the surface of the first inorganic insulating film at the second opening is an acute angle.

4. The active matrix substrate according to claim 1, further comprising
a bias wire connected to the photoelectric conversion element, and
a third inorganic insulating film that covers the bias wire and the second inorganic insulating film.

5. The active matrix substrate according to claim 1, further comprising:
a bias wire connected to the photoelectric conversion element;
a third inorganic insulating film that covers the bias wire and the second inorganic insulating film;
a second planarizing film provided on the third inorganic insulating film; and
a fourth inorganic insulating film provided on the second planarizing film at least at the end of the substrate,
wherein an end of the second planarizing film at the end of the substrate is covered with the fourth inorganic insulating film.

6. The active matrix substrate according to claim 1, further comprising
a metal film provided on the tapered portion of the first planarizing film,
wherein a surface of the metal film is covered with the second inorganic insulating film.

7. The active matrix substrate according to claim 4, further comprising
a metal film provided on the second inorganic insulating film that covers the tapered portion of the first planarizing film,
wherein a surface of the metal film is covered with the third inorganic insulating film.

8. The active matrix substrate according to claim 1, wherein the acute angle is equal to or less than 25°.

9. An image capturing panel comprising:
the active matrix substrate according to claim 1; and
a scintillator that is provided on a surface of the active matrix substrate and converts an X-ray into scintillation light.

* * * * *